US010065322B2

(12) United States Patent
Hopkins et al.

(10) Patent No.: US 10,065,322 B2
(45) Date of Patent: Sep. 4, 2018

(54) ACTIVELY CONTROLLED MICROARCHITECTURES WITH PROGRAMMABLE BULK MATERIAL PROPERTIES

(71) Applicant: THE REGENTS OF THE UNIVERSITY OF CALIFORNIA, Oakland, CA (US)

(72) Inventors: Jonathan Hopkins, Los Angeles, CA (US); Yuanping Song, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/379,311

(22) Filed: Dec. 14, 2016

(65) Prior Publication Data

US 2017/0157777 A1 Jun. 8, 2017

Related U.S. Application Data

(63) Continuation of application No. PCT/US2015/036751, filed on Jun. 19, 2015.
(Continued)

(51) Int. Cl.
*G05B 19/418* (2006.01)
*B25J 13/08* (2006.01)
(Continued)

(52) U.S. Cl.
CPC ............ *B25J 13/08* (2013.01); *B25J 9/0015* (2013.01); *B25J 9/08* (2013.01); *B25J 9/1617* (2013.01);
(Continued)

(58) Field of Classification Search
CPC ... B25J 13/08; B25J 9/0015; B25J 9/08; B25J 9/1617; B25J 19/02; B81B 7/008; G05B 2219/39146; G05B 2219/45073
(Continued)

(56) References Cited

U.S. PATENT DOCUMENTS 5,523,662 A * 6/1996 Goldenberg ............... B25J 9/06
318/568.11
5,988,845 A * 11/1999 Murata ................... B25J 9/1617
700/2
(Continued)

FOREIGN PATENT DOCUMENTS

JP 2013-126489 A 6/2013

OTHER PUBLICATIONS

Korean Intellectual Property Office (KIPO), International Search Report and Written Opinion dated Sep. 24, 2015, related PCT International Application No. PCT/US2015/036751, pp. 1-9, with claims searched, pp. 10-13. The relevance of non-English language reference JP 2013-126489 is indicated therein.

*Primary Examiner* — Harry Y Oh
(74) *Attorney, Agent, or Firm* — O'Banion & Ritchey LLP; John P. O'Banion

(57) ABSTRACT

A microarchitectured material having a plurality of interconnected unit cells in 2D or 3D configurations. The permanent interconnections to adjacent unit cells include mechanical output structures driven by mechanical actuators. One or more sensors are preferably utilized, such as utilizing a sensing mode of the actuator, for detecting forces and or displacements applied to the unit cell. The unit cells are each controlled by a control circuit for generating drive signals to the actuators in the unit cell so that desired mechanical properties and/or shapes are exhibited by the microarchitectured material.

20 Claims, 25 Drawing Sheets

Related U.S. Application Data

(60) Provisional application No. 62/034,943, filed on Aug. 8, 2014, provisional application No. 62/015,390, filed on Jun. 20, 2014.

(51) Int. Cl.
  *B25J 19/02* (2006.01)
  *B81B 7/00* (2006.01)
  *B25J 9/00* (2006.01)
  *B25J 9/08* (2006.01)
  *B25J 9/16* (2006.01)

(52) U.S. Cl.
  CPC .............. *B25J 19/02* (2013.01); *B81B 7/008* (2013.01); *G05B 2219/39146* (2013.01); *G05B 2219/45073* (2013.01)

(58) Field of Classification Search
  USPC ........................................................ 700/248
  See application file for complete search history.

(56) References Cited

U.S. PATENT DOCUMENTS

| | | | |
|---|---|---|---|
| 6,084,373 A * | 7/2000 | Goldenberg | B25J 9/08 318/568.11 |
| 6,233,503 B1 * | 5/2001 | Yim | G06N 3/008 345/12 |
| 6,636,781 B1 * | 10/2003 | Shen | B08B 9/045 318/568.11 |
| 2003/0038607 A1 * | 2/2003 | Yim | A63H 33/042 318/568.11 |
| 2003/0109958 A1 * | 6/2003 | Hogg | G06N 3/008 700/245 |
| 2004/0103738 A1 * | 6/2004 | Gao | B25J 7/00 74/490.01 |
| 2012/0094060 A1 * | 4/2012 | Gershenfeld | B32B 5/12 428/99 |
| 2013/0243997 A1 * | 9/2013 | Spadaccini | B32B 1/06 428/116 |
| 2013/0344601 A1 * | 12/2013 | Soman | A61L 27/14 435/396 |
| 2014/0222198 A1 * | 8/2014 | Emami | B25J 9/1617 700/250 |
| 2014/0273730 A1 * | 9/2014 | Brandwijk | A63H 33/042 446/484 |
| 2014/0298945 A1 * | 10/2014 | Rus | B25J 9/08 74/490.01 |
| 2016/0005331 A1 * | 1/2016 | Ryland | B25J 9/08 434/118 |
| 2016/0184993 A1 * | 6/2016 | Brandwijk | A63H 33/04 700/258 |

* cited by examiner

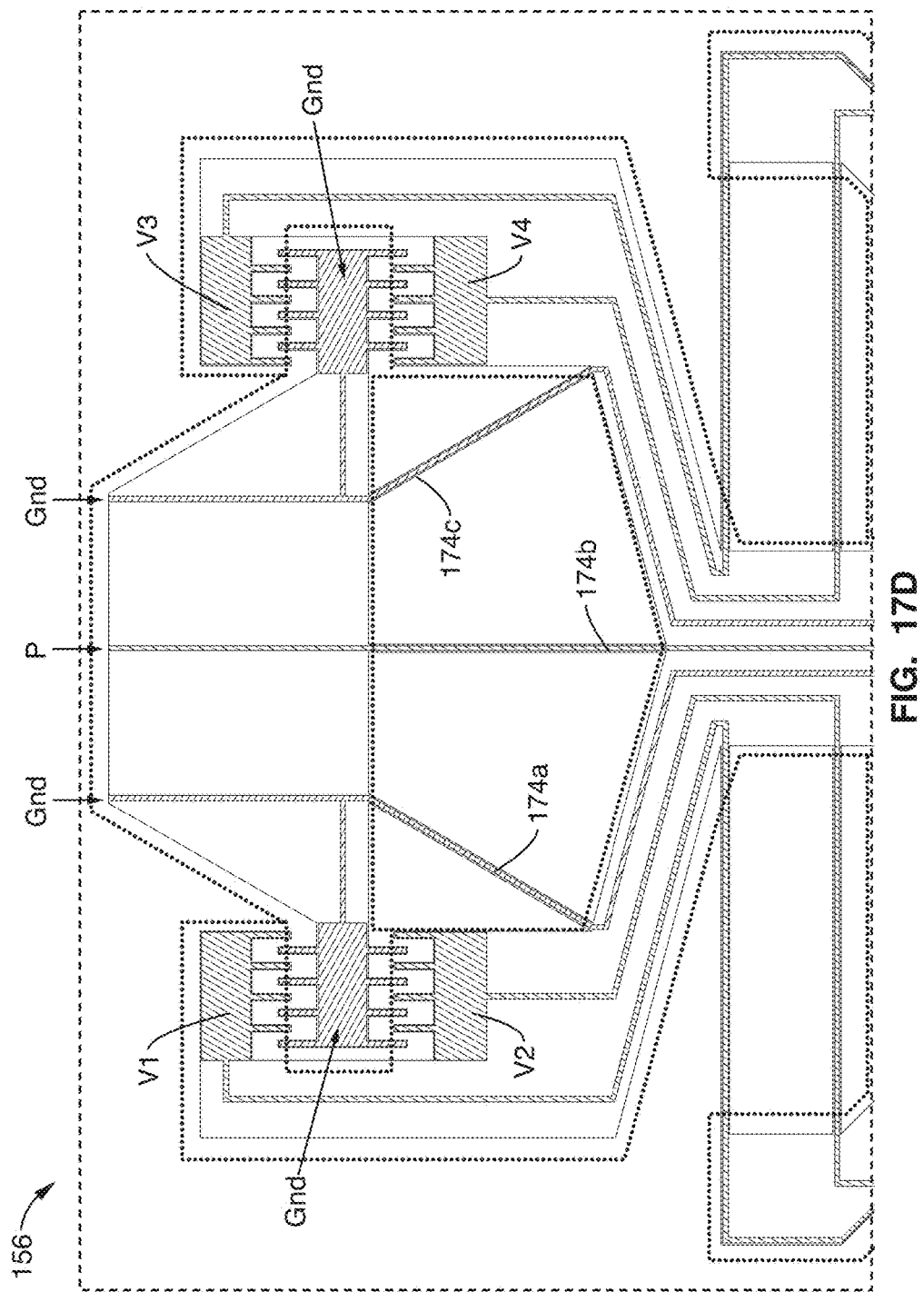

ACTIVELY CONTROLLED MICROARCHITECTURES WITH PROGRAMMABLE BULK MATERIAL PROPERTIES

CROSS-REFERENCE TO RELATED APPLICATIONS

This application is a 35 U.S.C. § 111(a) continuation of PCT international application number PCT/US2015/036751 filed on Jun. 19, 2015, incorporated herein by reference in its entirety, which claims priority to, and the benefit of, U.S. provisional patent application Ser. No. 62/034,943 filed on Aug. 8, 2014, incorporated herein by reference in its entirety, and which also claims priority to, and the benefit of, U.S. provisional patent application Ser. No. 62/015,390 filed on Jun. 20, 2014, incorporated herein by reference in its entirety. Priority is claimed to each of the foregoing applications.

The above-referenced PCT international application was published as PCT International Publication No. WO 2015/196111 on Dec. 23, 2015, which publication is incorporated herein by reference in its entirety.

STATEMENT REGARDING FEDERALLY SPONSORED RESEARCH OR DEVELOPMENT

Not Applicable

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technological Field

This technical disclosure pertains generally to programmable materials, and more particularly to actively controlled microarchitectured materials that can be programmed to achieve desired material properties and shape deformations.

2. Background Discussion

Various forms of robotic systems have arisen which utilize a plurality of unit-cell robots in a group, commonly referred to as swarm robotics or swarm intelligence. These autonomous robots are typically separate although they work in combination with one another to solve a problem, such as finding trapped victims in a disaster. Others have utilized these tiny unit-cell-like robots with actuators, sensors, and control circuitry, such as called 'Programmable Matter' by DARPA to reconfigure their shape by attaching and reattaching at different locations within a lattice as they crawl around each other to get to their final location. In certain proposals these robots don't completely attach and reattach, but use compliant joints that fold like origami structures to change their locations within the lattice.

However, other than these joints which provide for repositioning of the cell within the lattice, the cells of these existing designs are rigid and don't change their own shape, but only change the lattice's shape by changing their locations within the lattice.

Accordingly, a need exists for new robotic operating models which provide additional functionality in a materials arena.

BRIEF SUMMARY

Actively controlled microarchitectured materials are described which can be programmed to achieve desired material properties and/or shape deformations which are actively, and simultaneously, controlled in real-time. The changes in material properties, for example, include programming the microarchitectured material to exhibit different Young's modulus, shear modulus, Poisson's ratio, and so forth. The shape deformations include those performed in either two or three dimensions. Actively controlled microarchitectures are lattices of small, compliant, permanently joined unit cells that are each independently controlled using actuators (e.g., electrostatic combs, piezoelectric actuators (piezos), Lorentz force actuators, etc.), and sensors (combs, strain gauges, optical sensors, etc.), which are controlled by control circuitry (IC Chip). Wiring connects the control circuitry from the center of the unit cell to the actuators and optional sensors, typically at the periphery of the unit cell. In addition, an antenna may be included in the unit cells (or one or more of the unit cells) for wireless downloading of programs. The actively controlled microarchitectured lattices perform either: (1) responding to external loads in a controlled fashion and thereby exhibiting a desired bulk property, or (2) forming a desired net lattice shape through the deformation of each cell's flexible elements.

The present disclosure departs from existing robotic swarm and programmable matter systems which use their actuators and sensors to reposition themselves in a collective while they do not respond to external loads so they are unable to be programmed to exhibit desired properties. These previous systems rely on the unit cells moving about to reconfigure the lattice shape, and not on unit cells that remain with permanent connections to the same neighboring unit cells. In addition, the previous technology cannot provide for significantly changing its material properties.

The technology presented herein utilizes actuators, sensors, and control circuitry within tiny unit cells that make up a lattice, but these actuators and sensors are used to sense and respond to external loads so that the microarchitectured material exhibits properties in response to how it has been programmed. In one example application, the actuators push back against a force that is being imparted on the bulk lattice, so that the material appears stiffer. Depending on how hard the actuators have been programmed to push back, determines how stiff the material will be. These actuators and sensors can also change the overall shape of the lattice that they constitute, but they do so by imparting forces within each cell that deforms the compliant elements and thereby changes the shape of the entire lattice. The unit cells in the lattice are at fixed locations and they do not de-attach, move, and then reattach at different locations within the lattice in the manner of existing designs.

Further aspects of the presented technology will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The disclosed technology will be more fully understood by reference to the following drawings which are for illustrative purposes only:

FIG. 17A through FIG. 17D are schematics of a section of the 2D microarchitectured unit cell shown in FIG. 16.

DETAILED DESCRIPTION

The actively controlled microarchitectures with programmable bulk material properties of the present disclosure can be implemented in various ways altering the characteristics of material properties and/or shape deformation changes, such as toward providing suitability for numerous applications. The following items are specific design examples provided by way of example and not limitation. Two primary categories of devices are described: (1) designs that use combination actuators and sensors (e.g., electrostatic combs), and (2) designs that use actuators without intrinsic sensors (e.g., piezo material actuators).

1. Unit Cells Using Combs as Actuators and Sensors.

1.1 2D Square Embodiments.

Figure 1:
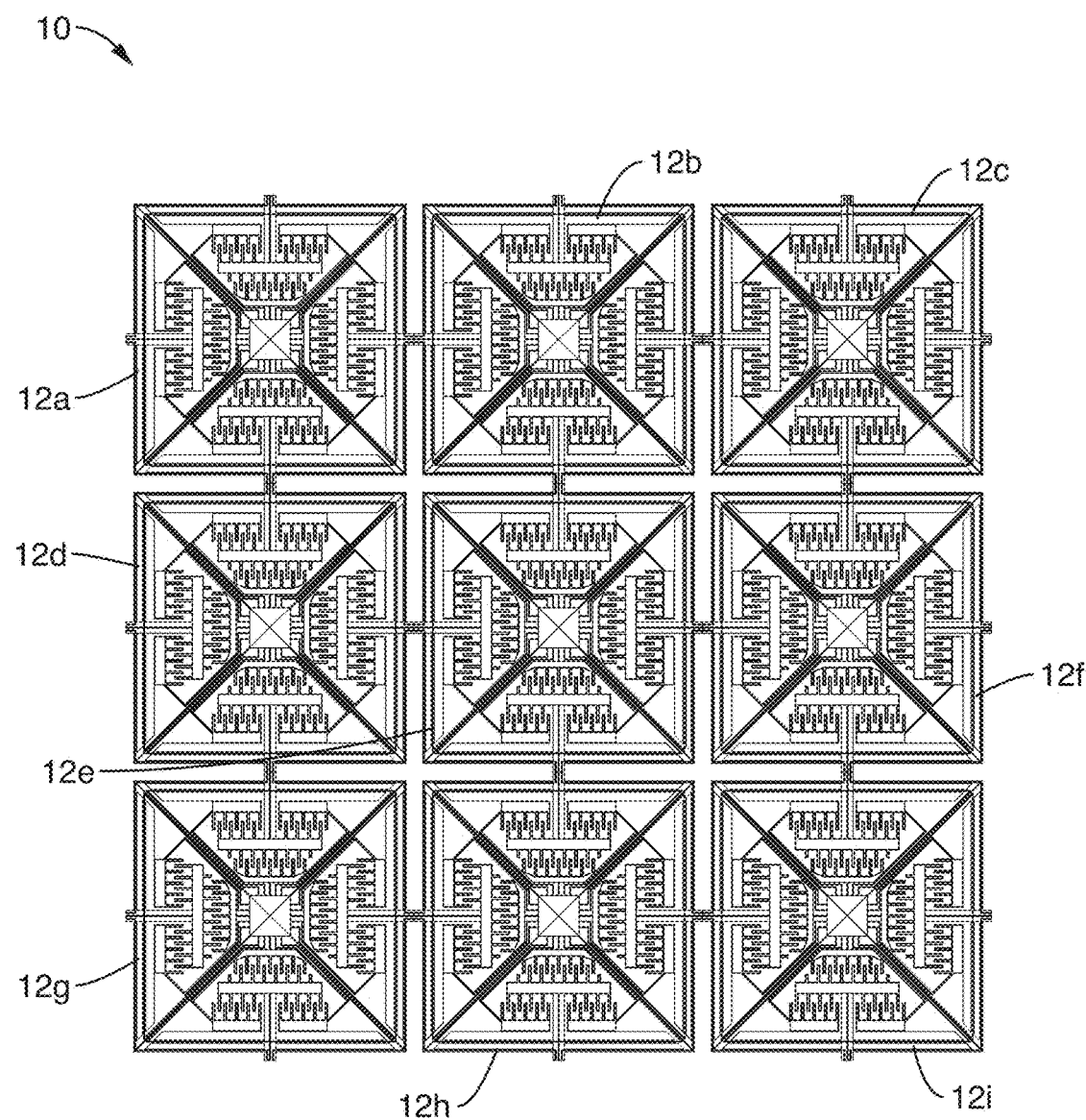
FIG. 1 is a schematic of a 2D microarchitectured material array according to an embodiment of the present disclosure.
Figure 2:
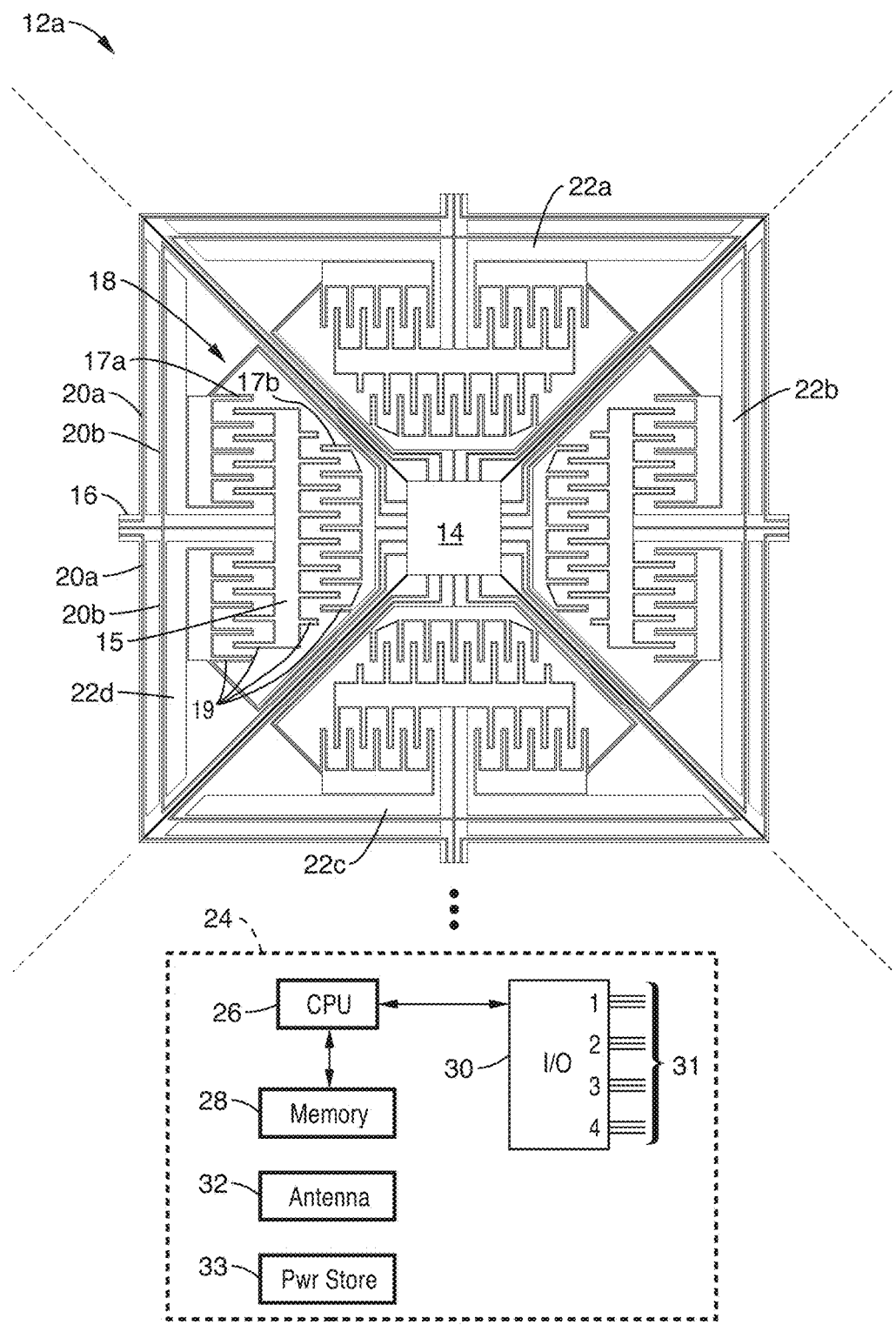
FIG. 2 is a schematic of a 2D microarchitectured unit cell from the array of FIG. 1.
Figure 3:
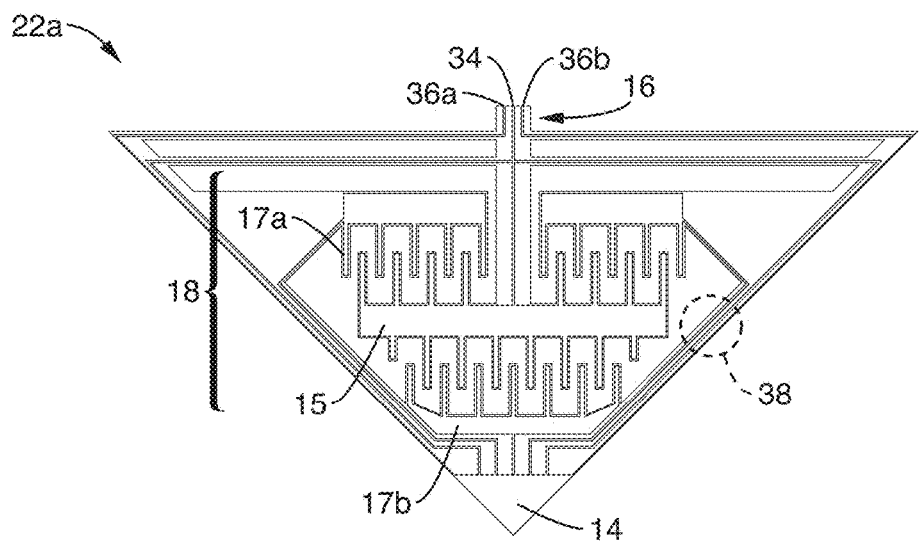
FIG. 3 is a schematic of a section of the 2D microarchitectured unit cell from FIG. 2.

FIG. 1 through FIG. 3 illustrate example embodiments of active microarchitectured materials having a two dimensional structure which relies on utilizing capacitive combs as actuators and sensors. In FIG. 1 a 2D design embodiment 10 is seen with a 3×3 lattice comprising unit cells 12a through 12i. It should be appreciated that a 2D structure according to the present disclosure need not be retained in a flat planar arrangement, as it may be alternatively shaped over curves, angles, irregular contours, textures, and so forth without departing from the teachings of the present disclosure.

In FIG. 2 a single unit cell is seen from within the lattice of FIG. 1, having a center area 14 for containing circuitry, such as preferably in the form of an integrated circuit (e.g., IC chip), for controlling the operations of the unit cell. In addition, in at least one embodiment, an antenna is also placed in this area allowing external communication, for example wirelessly uploading programs to be executed by the control circuit. In at least one embodiment, this center area 14 would contain power storage, such as a rechargeable battery, dual layer capacitor, or other form of power storage or power generation. It will be appreciated that the use of either power storage or an antenna are described as optional elements for use in certain applications.

Each active portion (side) 22a, 22b, 22c, 22d of the square unit cell 12a possesses a rigid shuttle 15 with output stem 16, as the moving portion of a capacitive comb element 18 having fingers 19 on both sides of shuttle 15 whose fingers 19 interdigitate with those in non-moving portions 17a, 17b of the capacitive comb. The labeled shuttle 15, 16 has been darkened in to more readily indicate the entire region considered to be part of the rigid shuttle. It should be appreciated that other actuator types may be utilized in place of the combs, such as piezos, Lorentz force actuators, other forms for actuators and combinations thereof. Each rigid shuttle is constrained by flexures, with the present embodiment shown incorporating two layers 20a, 20b, of flexures. The flexures comprise flexible elements that deform to guide motions, thus allowing the shuttle to freely translate along the shuttle axis (i.e., along a direction that is perpendicular to the length of the axes of the flexure). It will be appreciated from FIG. 1 that each unit cell attaches at the output ends of its shuttles to the output ends of shuttles within adjacent unit cells. These points of attachment always remain joined together, as the unit cells do not change position. It should also be appreciated that configurations can be implemented with multiple actuators/sensors, configured for coupling to a single mechanical output/input extending from the unit cell.

By way of example FIG. 2 is shown with a processor-based control circuit 24, having at least one computer processor 26 (e.g., CPU, microcontroller, processor embedded within an ASIC, etc.), and at least one memory 28 (e.g., RAM, DRAM, NVRAM, FLASH, computer readable media, etc.) whereby programming (instructions) stored in the memory are executed on the processor to perform the steps of the various process methods described herein, as well as for storing data. The processor 26 either has internal voltage input/output control, or utilizes external circuitry 30 for generating output voltages 31 for driving the actuators within the unit cell. In addition, these I/O can include sensor inputs, allowing the processor to sense forces, displacements and other characteristics of the unit cell. An optional element of an antenna 32 is shown in this processor block and is considered to include any other communication circuits necessary in a wired or wireless communications interface, and thus block 33 comprises a means 32 for wireless communication between processors, and/or to outside of the array. The processor itself can support wired communication between processors. Optional power storage 33 is also seen, such as for driving the unit cell when sufficient external power is not available. It should be appreciated that in certain applications, the amount of material changes are few, and thus the average current requirements are low. Having power storage (e.g., rechargeable battery or capacitor) allows supporting a high level of instantaneous current even if the amount of current supplied by the conductors to the unit cell is more meager. The presented technology is non-limiting with regard to memory and computer-readable media, insofar as these are non-transitory, and thus not constituting a transitory electronic signal.

In at least one embodiment, some or all of the unit cells in the material lattice, are configured for external communications, such as communicating to a central control device, communicating with one another, or combinations thereof. These external cellular communications allow the unit cells to cooperate with one another toward achieving a specific material property and/or shape. Embodiments of the present disclosure rely on external communication in some form or other when the unit cells are unable to determine from their own external environment what its proper action should be. Morphing to any arbitrary shape, for example, requires the unit cells to perform different actions irrespective of sensed external forces. Obtaining other lattice property/shape objectives can require unit cells to impart differing shapes and/or material properties in relation to their neighboring cells, or based on some time-variant function. It will be appreciated that certain applications will require synchronization of local actions between the unit cells so that the resultant global actions are unified toward meeting the shape/material-property objective.

Figure 18:
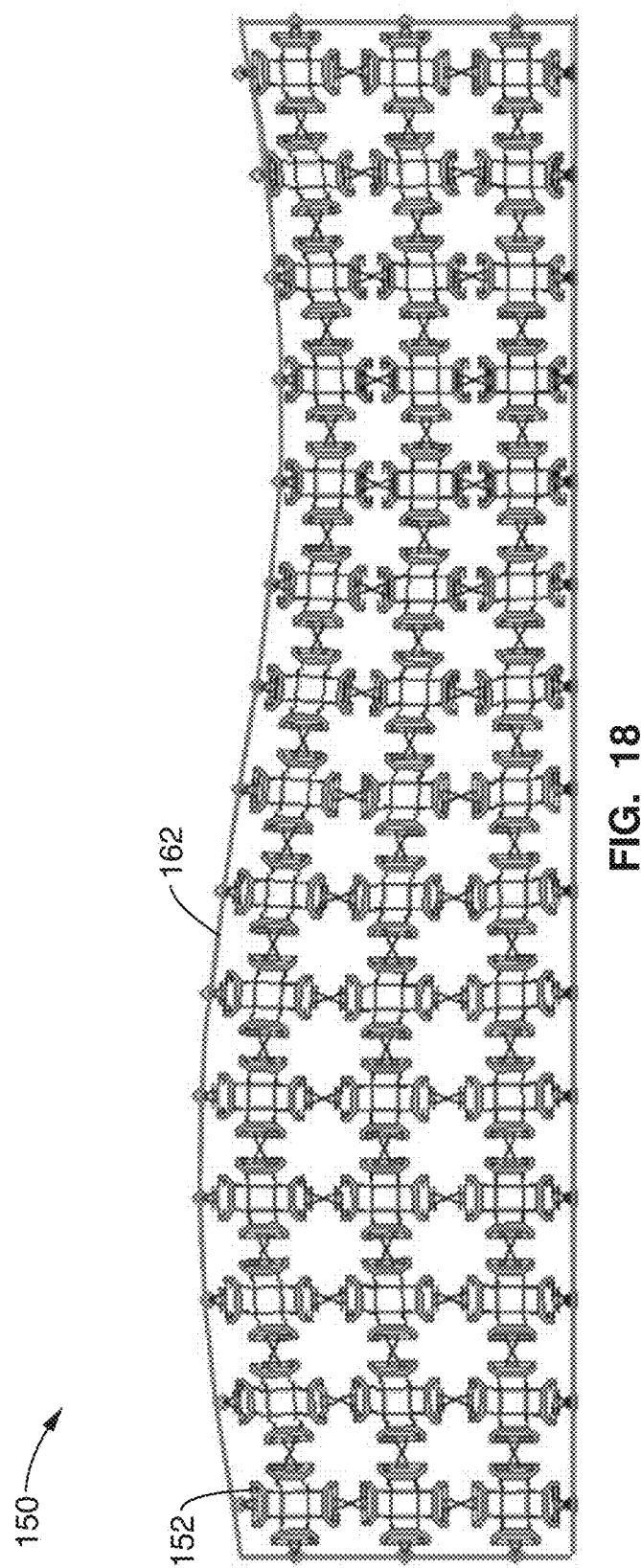
FIG. 18 is a schematic of the 2D microarchitectured material array of FIG. 15 is shown performing shape morphing according to an embodiment of the present disclosure.

Consider for example an objective to generate a sine wave in the upper boundary 162 seen in the lattice of FIG. 18. Communication would be needed to change the commands to each unit cell in fulfilling these dynamic shape changes. This communication could be from a central processor, or distributed processing within the lattice in response to receiving an external command. If the sine wave were to be generated at a sufficiently rapid rate, synchronization would be necessary to prevent communication delays in the lattice from causing discordant outputs, thus not achieving the proper sine wave output. In an embodiment in which each processor follows its own time-variant function based on an instruction input to modulate its mechanical output, it would also be important to keep the unit cells synchronized so that the respective timing of their shape/material-property outputs would not drift with respect to one another. There are numerous applications which would benefit from these communications and/or synchronizing actions across the material lattice.

It should be appreciated that for exhibiting material properties, including stiffness, damping, Poisson's ratio, and so forth, there may be no need for extracellular communications (e.g., from an external control device to each unit cell, and/or unit cell to unit cell communications), as each cell operates autonomously in response to mechanical loads as they are individually programmed to do so. In this configuration the advantageous ideas of swarm control are utilized in which an overall lattice property emerges from the simple control within each individual cell, and the cells need not be cognizant of their position or role in the collective of units cells defined in the lattice. However, many behaviors like shape changing or distributed sensing can benefit from, or even necessitate, extracellular communications. For example, to perform bulk shape changes, each cell needs to know where it is in the lattice so that it may take on a unique and individual shape according to instruction given it toward collectively achieving the desired shape for the material lattice. For the case of distributed sensing, each unit cell would determine how it has been deformed and would relay that information so that lattice level (global) decisions can be made (e.g., either through a central command structure, or a distributed command structure).

It will be appreciated that numerous forms of array communications are available to implement extracellular communications (e.g., wired or wireless). These communications are configured to (1) allow some or all of the unit cells to receive instructions from outside the array, and/or (2) some or all of the unit cells to communicate with one another. Communication to a control source outside of the array can be achieved in a number of ways. A command may be received by a single unit cell which passes it through the lattice. With each unit cell having an identifier, the central control element can direct each unit cell, or pass a sequence of instructions to each unit cell. The commands can also be passed to multiple unit cells along one or more edges of the lattice to speed communication through the whole lattice. Furthermore, a wired or wireless communication can be coupled to each unit cell, wherein each unit cell simultaneously receives instructions. Alternatively, or additionally, a cell to cell communications is implemented according to at least one embodiment that allows neighboring control circuits to communicate with one another, such as for passing along information so the cells can interoperate on performing a cooperative action. As these communication techniques are generally known for electronic element arrays and processor arrays, there is no need to provide additional discussion herein.

Returning now to the description of FIG. 1 through FIG. 3, it will be seen that FIG. 3 shows a close up of one of the four triangular sectors 22a from FIG. 2 which make up each unit cell, showing the same control circuit 14, along with the same comb structure 18 having shuttle 15, shuttle output 16, fixed combs 17a, 17b, and fingers 19 on the fixed combs and shuttle combs. The control circuit 14 is preferably electrically grounded through conductor (line) 34, and receives external power through conductors (lines) labeled 36a, 36b. It should be appreciated that through these lines a power storage element could also be recharged.

It will also be noted that the shuttle output 16 of the electrostatic comb region is also electrically grounded by line 34. Control circuit 14 is interconnected by conductors (e.g., wiring such as circuit traces) 38 to the comb regions 17a, 17b of the comb device 18. One of ordinary skill in the art will recognize that a design may utilize different routing of the conductive pathways without departing from the teachings of the present disclosure. By generating voltages to the actuators the control circuit (e.g., IC chip) can pull the shuttle in an outward direction (upward for side 22a), or in an inward direction (downward for side 22a), with an electrostatic force that is proportional to the voltage it imparts. In this way, the control circuit controls the amount of force exerted on the shuttle in both directions (i.e., inwards and outwards).

It should be appreciated that embodiments can be provided which only generate force in a single direction (inward or outward for side 22a), although this is generally less preferable as it only saves the need for a second line and its associated I/O for each section while reducing the extent of device control.

As seen above, the combs serve in the system as actuators for the cell. In many embodiments the same combs can also be utilized to sense location of the shuttle with respect to the body of the unit cell. In at least one embodiment, these combs are encased in a nonconductive coating so they do not short out even if the combs of the shuttle come in contact with the combs receiving the voltages from the control circuit chip. Thus, the control circuit of each unit cell can respond to external loads placed on the shuttles, such as by applying force to push the shuttles either inwardly or outwardly to exhibit a variety of bulk lattice properties. If the control circuits push out (outward) the shuttles in response to detecting compression, then the lattice will be stiff. If, however, the control circuit pulls in the shuttles in response to detecting compression, then the lattice will be extremely compliant (it may even achieve zero or negative stiffness). Similarly, the control circuit can apply inward or outward force to the shuttles in response to detecting tension forces. If the control circuit pulls inwardly on the shuttles which are orthogonal to the direction of a compression force, then the material will exhibit a negative Poisson's ratio. Since stiffness (Young's modulus) and Poisson's ratio can be controlled, so can shear modulus. Furthermore, if the lattice is hit with a time dependent load, the shuttles can be controlled by the control circuit to ring back and forth or remain in their place so that properties of damping can be controlled. Thus almost any mechanical property can be achieved according to the instructions encoded for execution by the control circuit of each unit cell. Finally, it is important to note that a similar version of the triangular sector shown in FIG. 3 could be inserted inside triangular or hexagonal unit cells to achieve passive isotropy. In other words, the present disclosure is not limited to square-shaped unit cells and orthotropic lattices.

1.2 3D Cube Embodiments.

Figure 4:
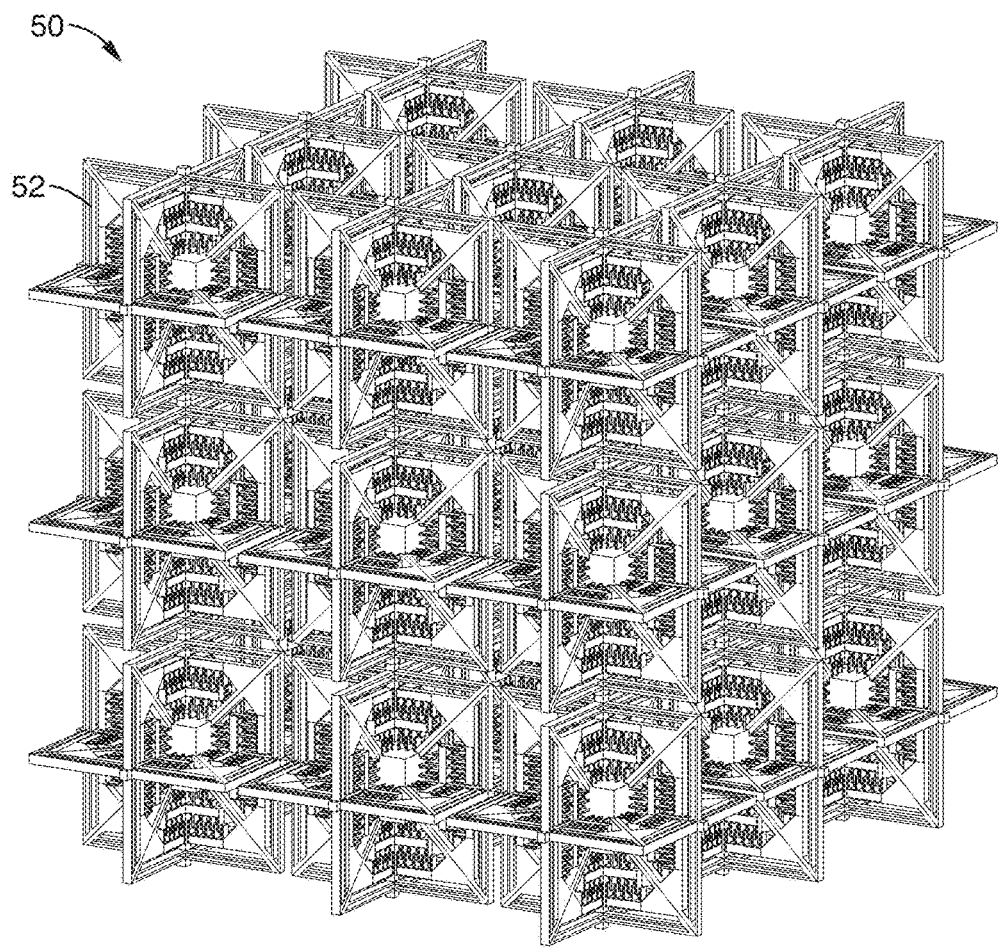
FIG. 4 is a schematic of a 3D microarchitectured material array according to an embodiment of the present disclosure.
Figure 5:
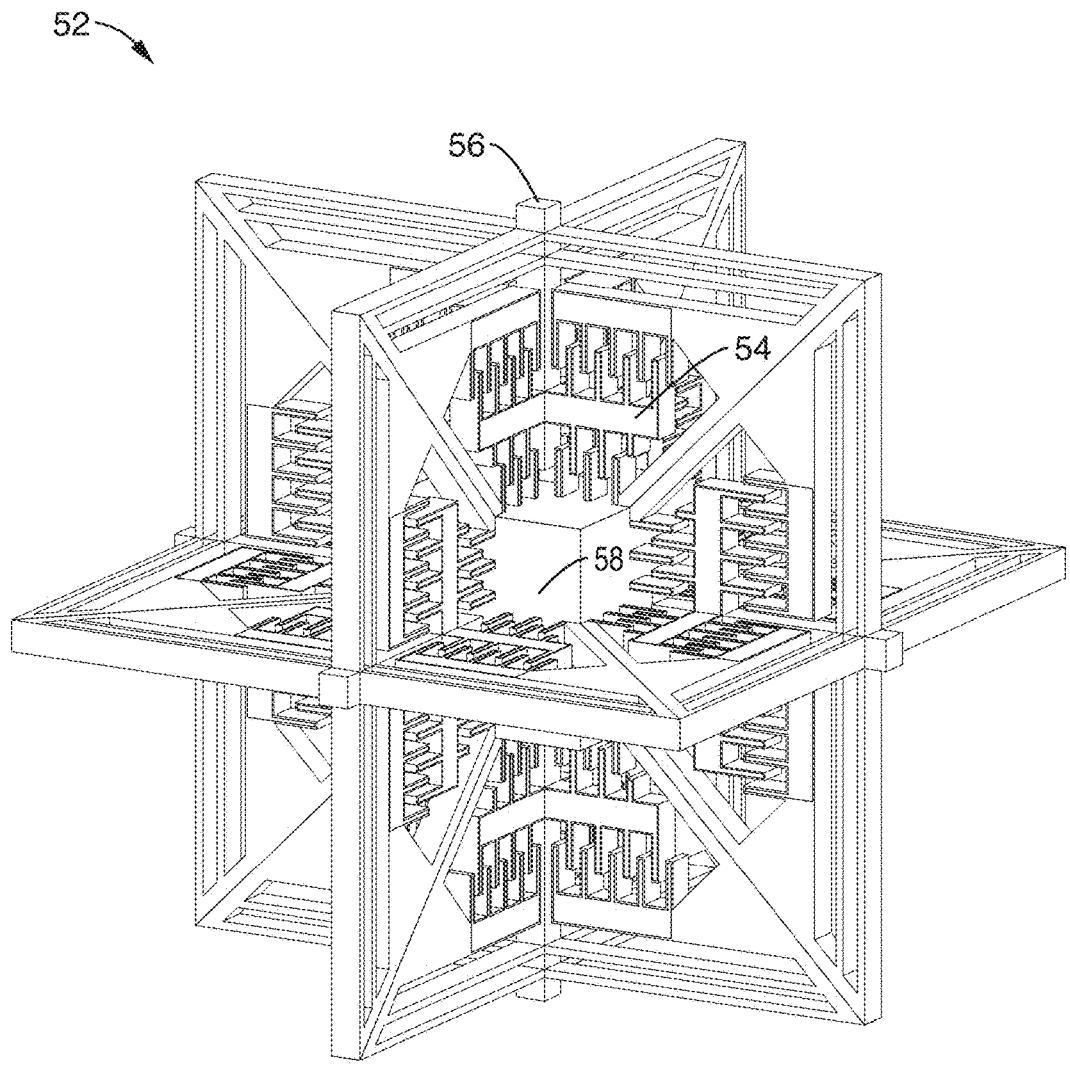
FIG. 5 is a schematic of a 3D microarchitectured unit cell from the array seen in FIG. 4.
Figure 6:
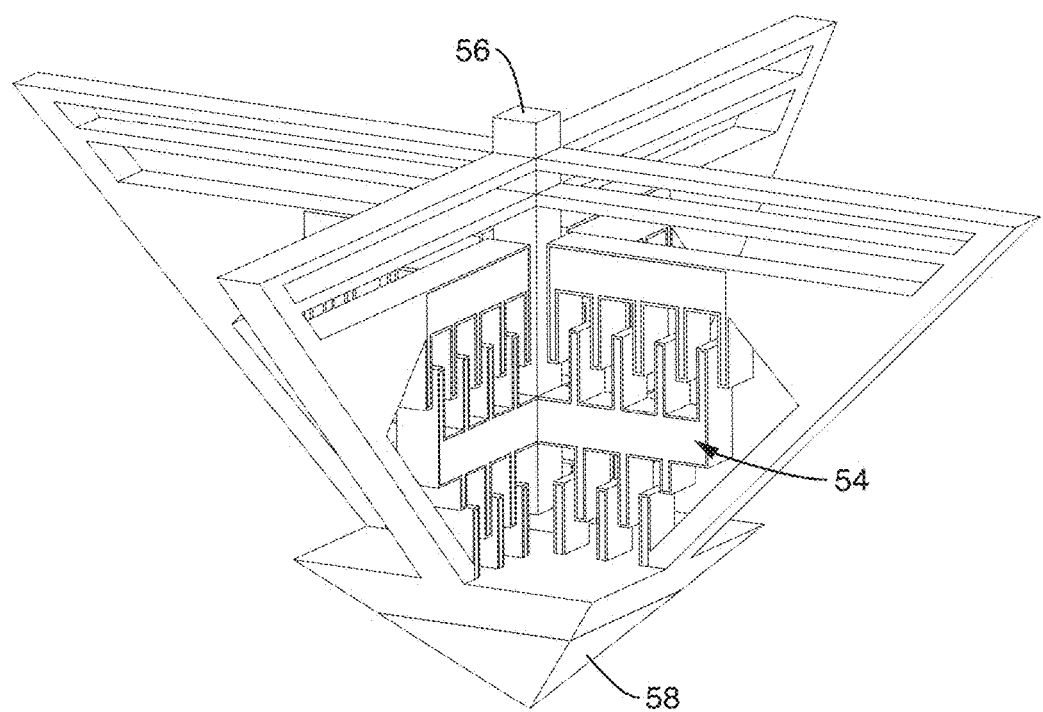
FIG. 6 is a schematic of a 3D section of the microarchitectured unit cell shown in FIG. 5.

FIG. 4 through FIG. 6 illustrate an example embodiment of a 3D version of the 2D unit cell seen in FIG. 1 through FIG. 3. In FIG. 4 is seen a 3×3×3 lattice 50 of this 3D unit cell design 52. It should be appreciated that the 3×3×3 array is shown by way of example and not limitation, as arrays may be constructed according to the various embodiments of the present disclosure with any desired number of elements in the x, y and z directions. Shown in FIG. 5 is a single cube-shaped unit cell 52 within this lattice. This unit cell basically consists of three square unit cells like those shown in FIG. 2 integrated into a 3D unit cell having orthogonal planes. It will be appreciated that single planar combs were seen in the previous figures, while each comb 54 in this 3D embodiment is formed from an orthogonal intersection of two combs, such as in a "X" pattern, with the shuttle still having a single output 56. For the sake of clarity of illustration the wiring is not shown coupling to the comb sections. It will be appreciated that this wiring can be implemented in the same manner as seen in FIG. 2, or by utilizing other means as will be known to one of ordinary skill in the art.

The control circuit along with any optional elements, such as power storage (e.g., rechargeable battery, charge storage capacitor) or antenna, occupy the core region 58 (e.g., cube-shaped in this example) at the center of the cell, a portion of which is seen in the figure. In FIG. 6 is seen one of the six identical pyramidal sections that make up the unit cell of FIG. 5.

1.3 2D Square Embodiment with Vibratory Prevention Flexures.

Figure 7:
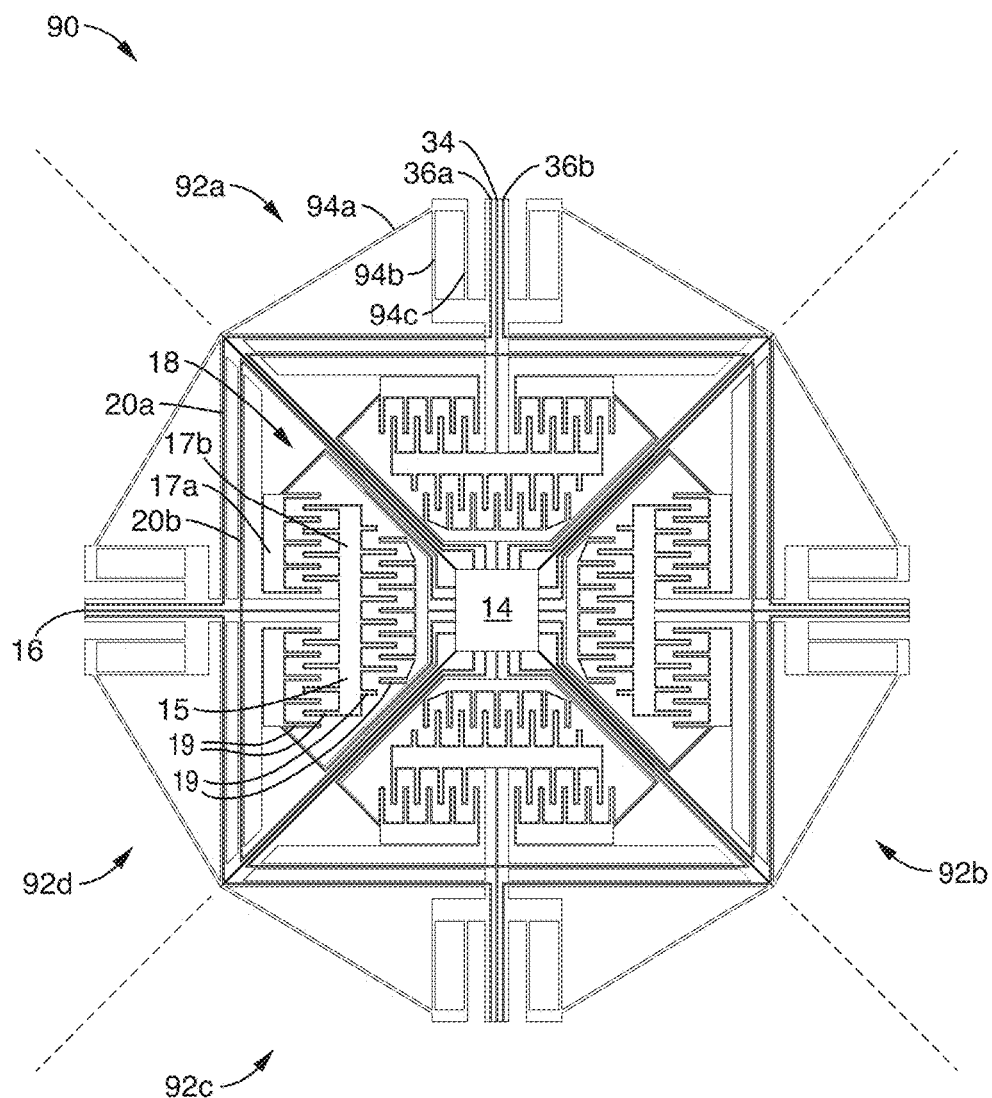
FIG. 7 is a schematic of a 2D microarchitectured unit cell having vibration control flexures according to an embodiment of the present disclosure.

FIG. 7 through FIG. 9B illustrate an example embodiment 90 of a unit cell design which is configured for mitigating vibratory effects. In FIG. 7 is seen a version of this embodiment, which is a modification to the embodiment seen in FIG. 1 through FIG. 3. The basic structure remains the same as seen by core control circuit 14, rigid shuttle 15 with mechanical output stem 16, within a capacitive comb element 18 having fingers 19 on both sides of shuttle 15 whose fingers 19 interdigitate with those in non-moving portions 17a, 17b of the capacitive comb. The power connections are seen 34, 36a, 36b, the same as in the embodiments of FIG. 1 through FIG. 3. The rigid shuttle is constrained by a first set of flexures 20a, 20b, to which an additional second set of flexures are added in each section 92a, 92b, 92c, and 92d seen in FIG. 7.

Figure 8:
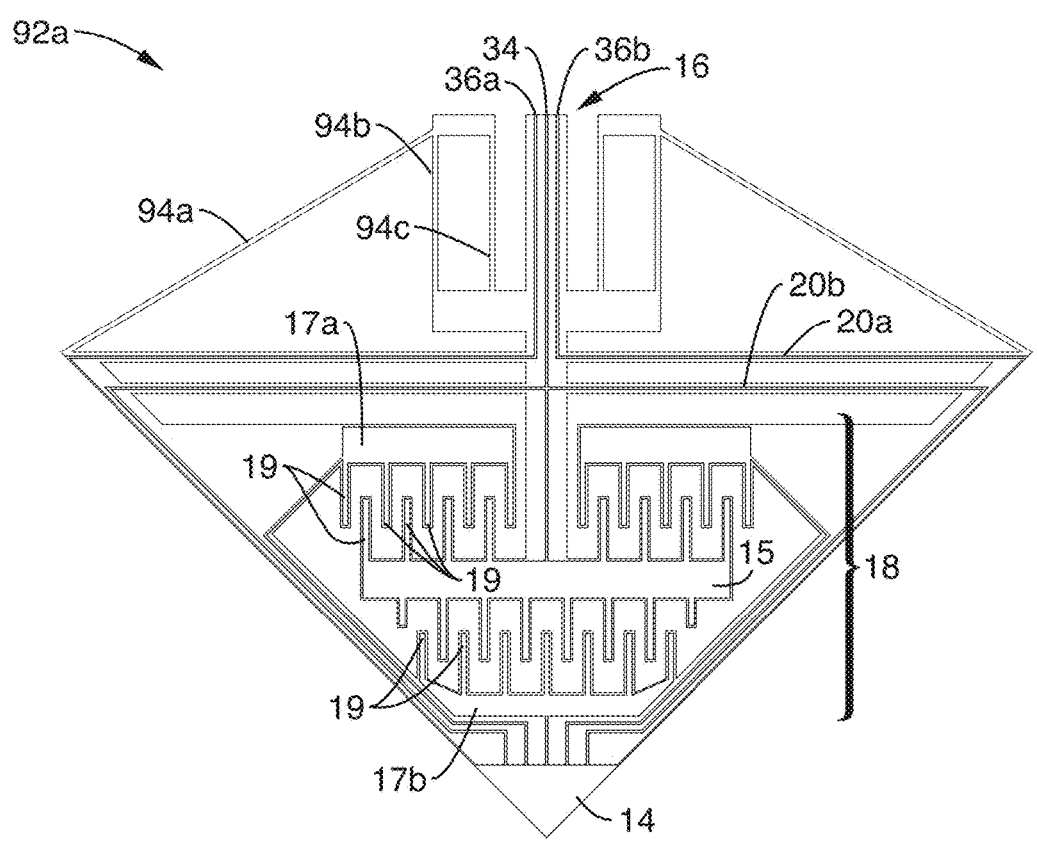
FIG. 8 is a schematic of a section of the 2D microarchitectured unit cell as shown in FIG. 7.
Figure 9A:
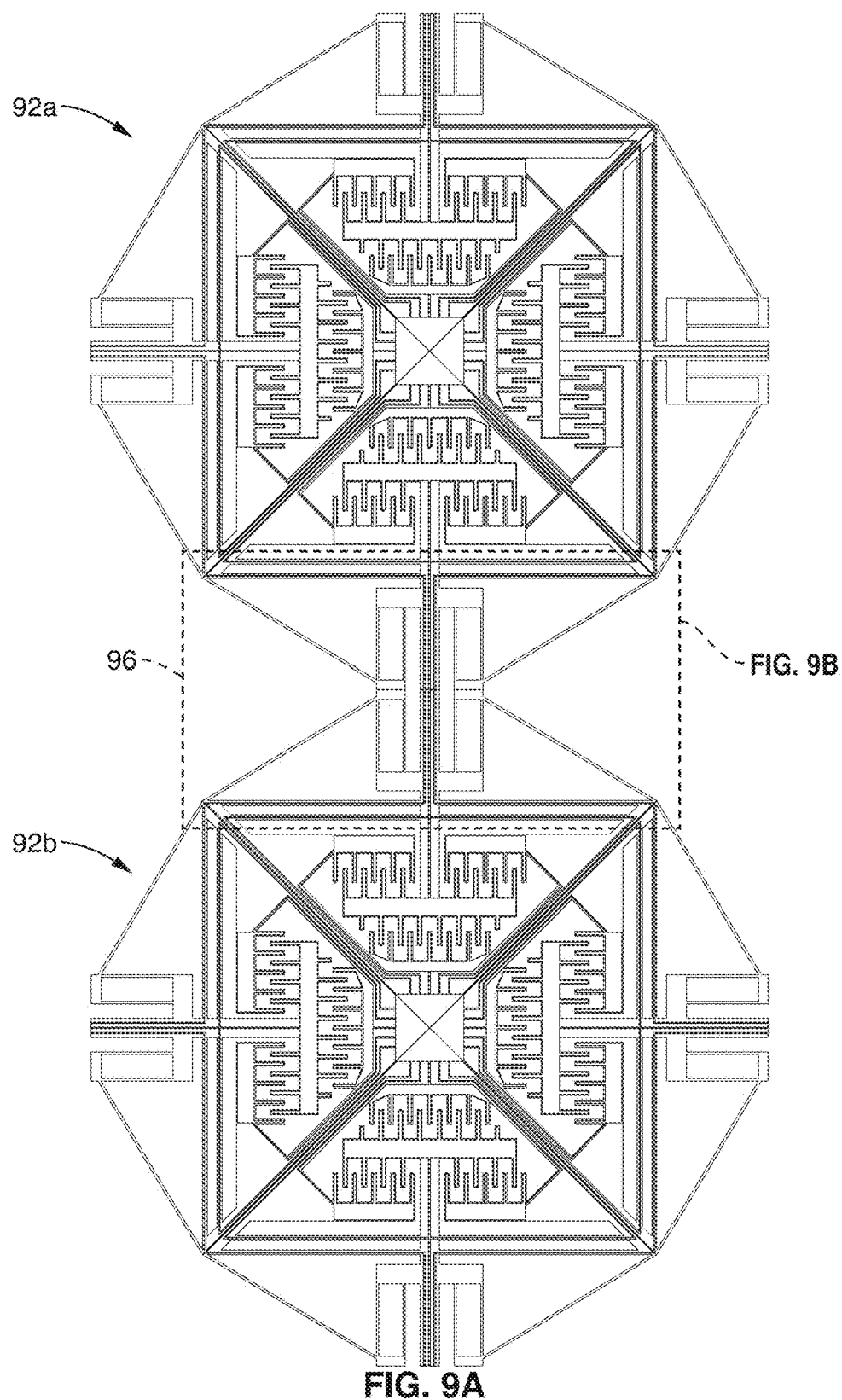
FIG. 9A and FIG. 9B are schematics of an interconnection between 2D microarchitectured unit cells as shown in FIG. 7.
Figure 9B:
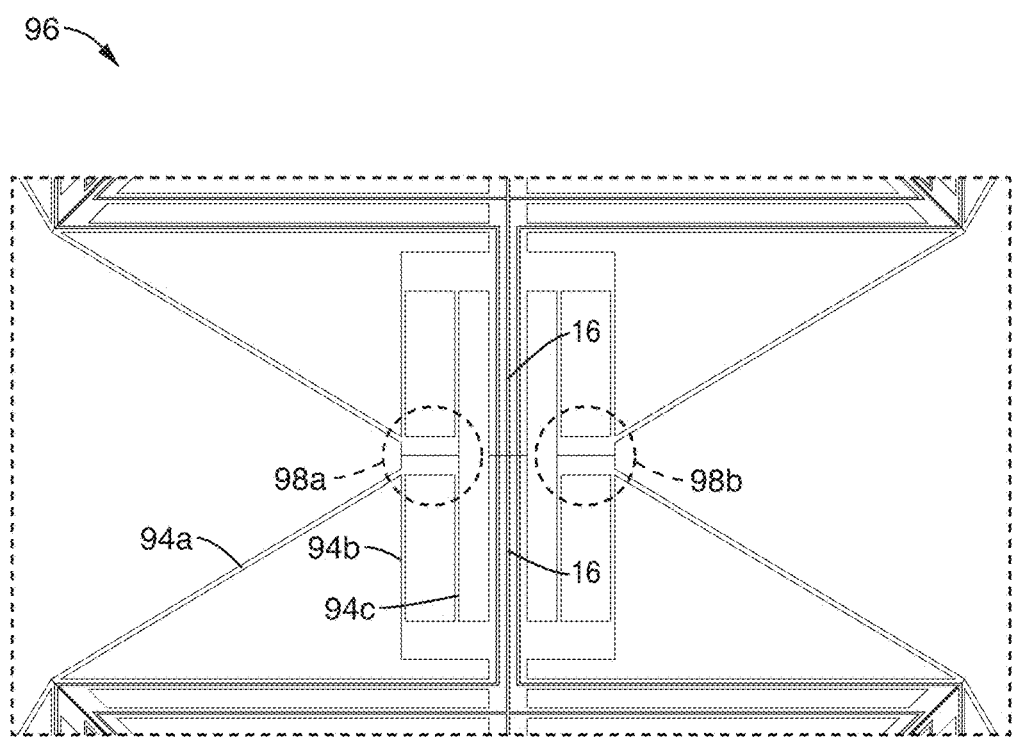

One issue that can arise with the previous embodiment is that if the unit cells of the lattice are held fixed, their shuttles are not constrained to be fixed with them. Accordingly, vibrations can induce the shuttles to translate back and forth which could misrepresent to the control circuit that the lattice is being loaded when it is not. In some instances, this could cause the controller to make the unit cells respond in an unstable manner. The embodiment shown in FIG. 7 through FIG. 9B provides additional flexures 94a, 94b, 94c, symmetrically disposed on each side of the output shaft from the shuttle to assure the shuttles are held fixed when the unit cells are held fixed and that the shuttles move in the correct directions when the lattice is loaded. In FIG. 8 one of the four triangular sections within the unit cell is more clearly seen, with the same elements 14, 15, 16, 17a, 17b, 18, 19, 20a, 20b, 34, 36a, 36b seen in prior embodiments and the new flexure elements 94a, 94b, 94c depicted. In FIG. 9A and FIG. 9B the connection between two unit cells 92a, 92b is seen to illustrate how these additional flexures operate. In FIG. 9A the two unit cells 92a, 92b are shown joined together, with an expanded view 96 seen in FIG. 9B. It can be seen in FIG. 9B that contact areas 98a, 98b make a flexure connection between unit cells 92a, 92b, while the shafts 16 from shuttles on these adjacent unit cells couple movement and force between the two unit cells.

1.3 3D Cube Embodiment with Vibration Preventing Flexures.

FIG. 10 through FIG. 14B illustrate an example embodiment of another 3D unit cell array 110 with its unit cell 112. It should be appreciated that a 3D embodiment can be created for the present disclosure by utilizing similar flexures to the new ones, added in the 2D embodiment seen in FIG. 7 through FIG. 9B, into the 3D embodiments seen in FIG. 4 through FIG. 6.

Figure 10:
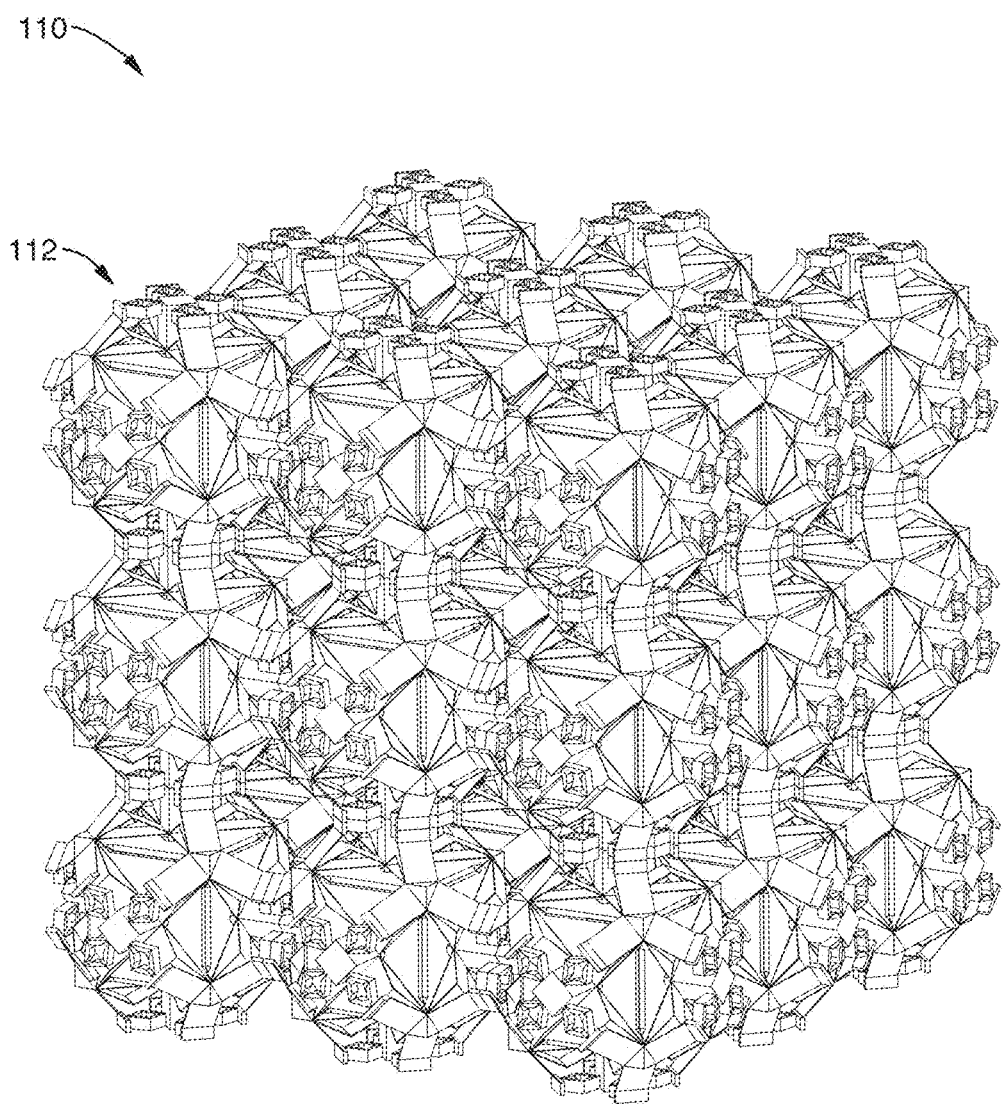
FIG. 10 is a schematic of another 3D microarchitectured material array according to an embodiment of the present disclosure.
Figure 11:
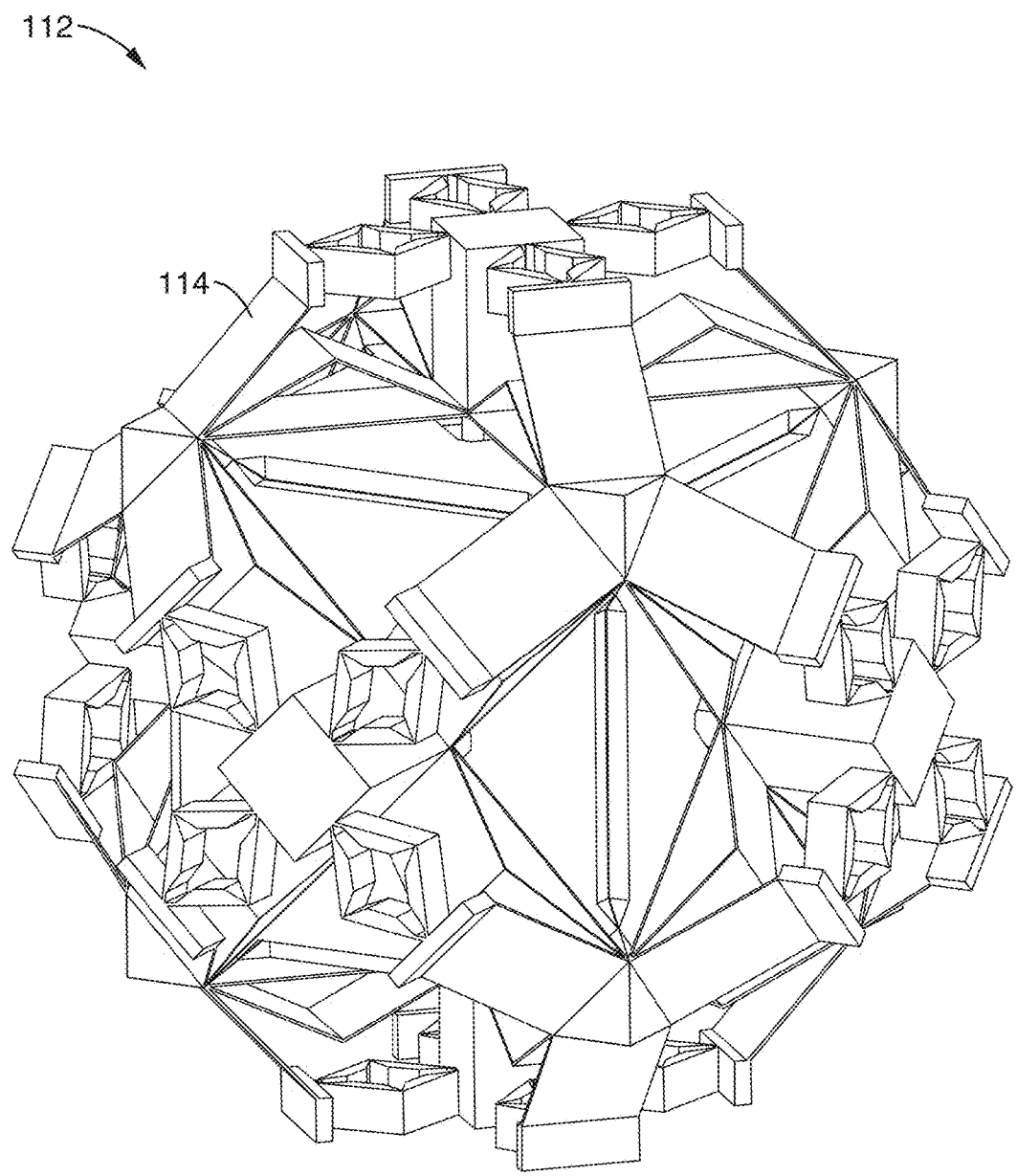
FIG. 11 is a schematic of a 3D microarchitectured unit cell from the material array of FIG. 10.
Figure 12:
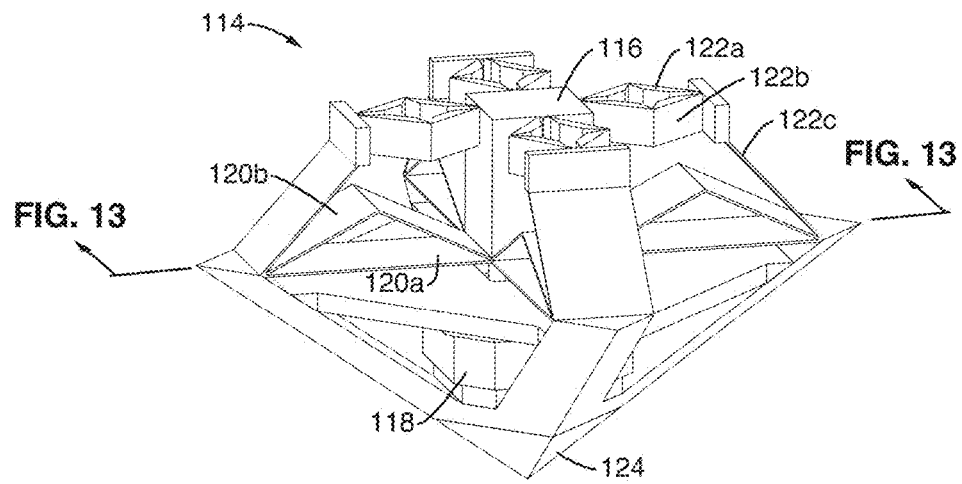
FIG. 12 and FIG. 13 are a schematic and a cross-section from the 3D microarchitectured unit cell seen in FIG. 11.
Figure 13:
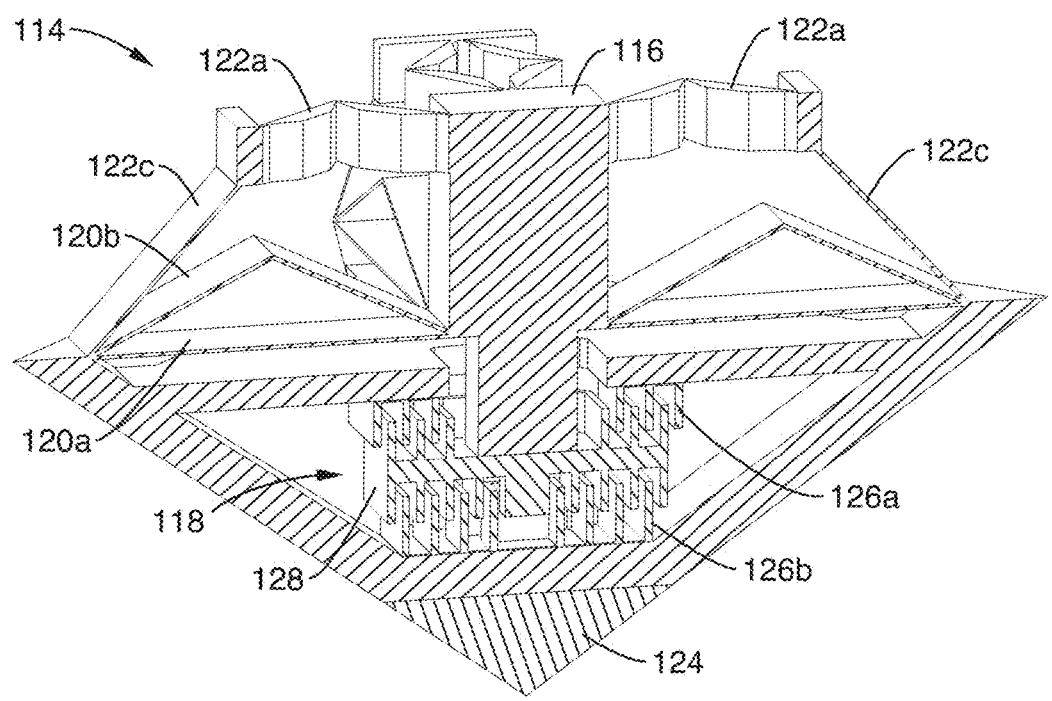

However, FIG. 10 through FIG. 14B illustrate an improved mechanism for mitigating vibratory effects. A new form of flexure is added here which accomplishes the same objective for preventing shuttle vibration and assures that the shuttles move in the correct directions. In FIG. 10 is depicted a 3×3×3 lattice 110 of these unit cells, while FIG. 11 depicts a single unit cell 112. In FIG. 12 is seen one of the six identical pyramidal sections 114 that comprise each unit cell 112. A mechanical output 116 of the rigid shuttle structure is seen coupled to electrostatic combs 118. On each side of mechanical output 116 is disposed flexures comprising a straight flexure 120a, and bent (or curving) flexure 120b, that guide the shuttles outward and inward translation. Flexures which prevent side to side vibrations of the mechanical output 116 are seen by opposing bent (curved) flexures 122a, 122b, along with a flexure 122c connecting 122a, 122b down to the housing. The combination of flexures 122a, 122b, 122c allow operation of the shuttle while preventing vibration. A portion of the core 124 is seen for the control circuit. In FIG. 13 is seen a cross section of this unit cell section (⅙ of the unit cell), within which the fixed combs 126a, 126b, and shuttle comb 128 (connecting to mechanical output 116) are seen.

Figure 14A:
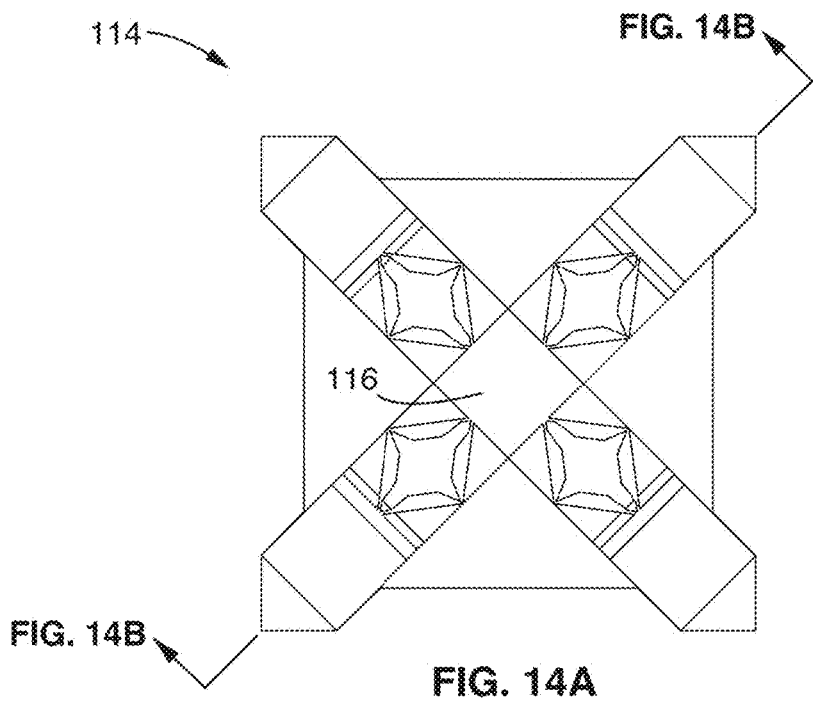
FIG. 14A and FIG. 14B are a top view and cross-section from the 3D microarchitectured unit cell seen in FIG. 11, with FIG. 14B depicting wiring.
Figure 14B:
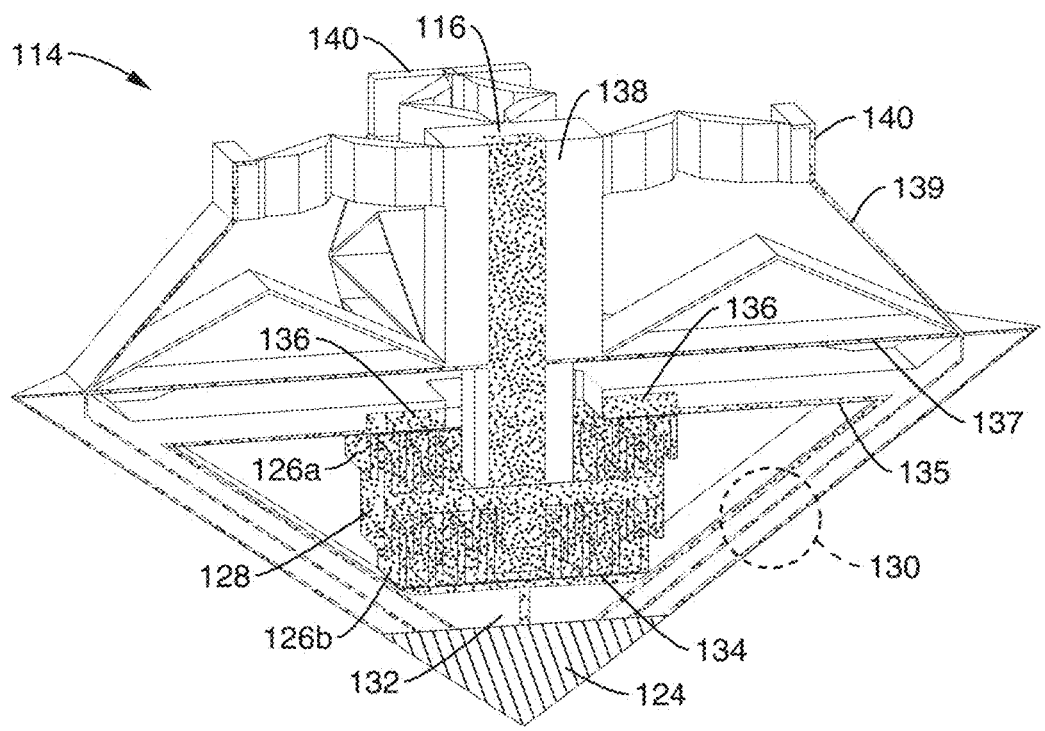
Figure 15:
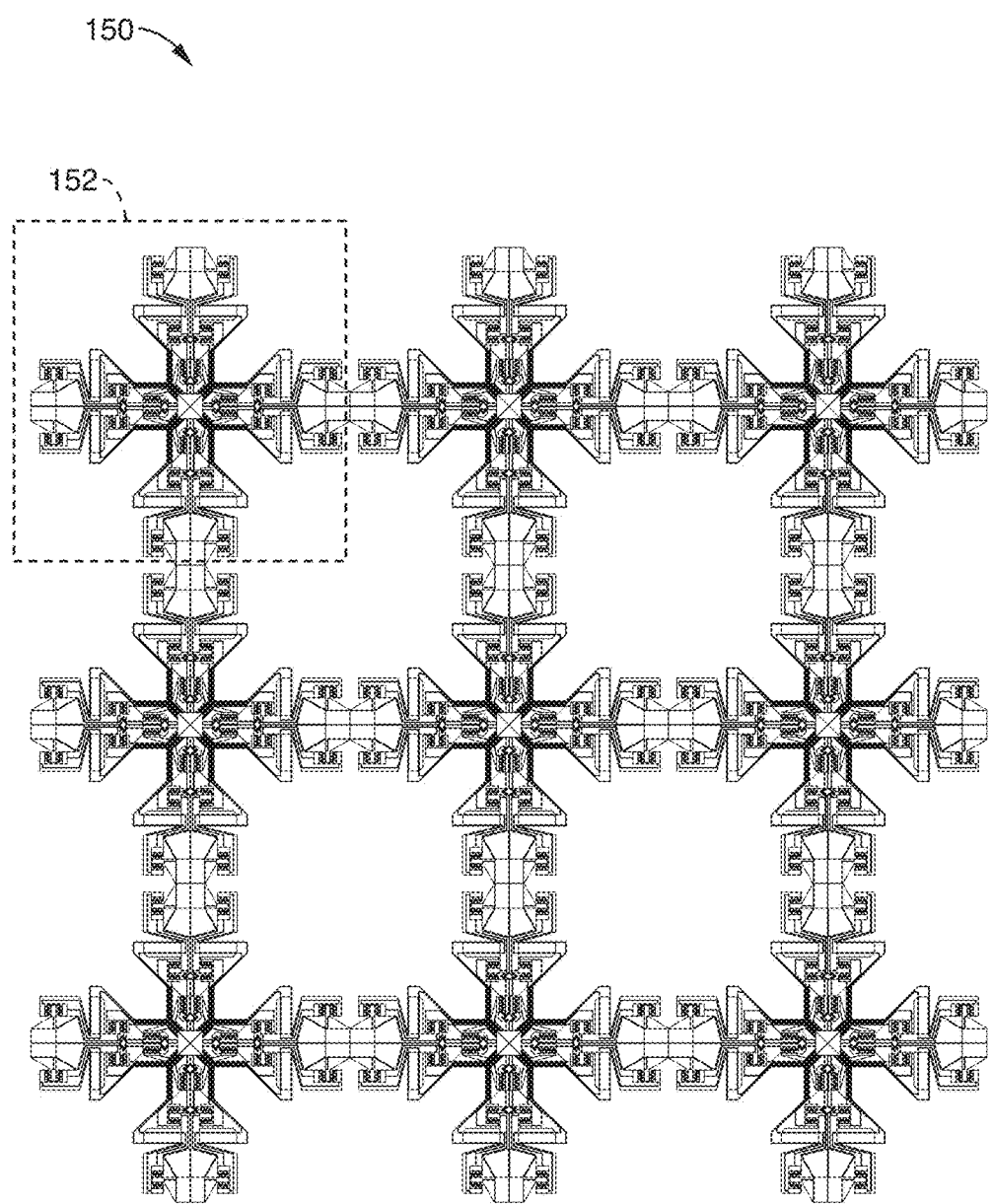
FIG. 15 is a schematic of another 2D microarchitectured material array according to an embodiment of the present disclosure.

In FIG. 14A a top view is seen and in FIG. 14B the elements of FIG. 13 are shown in an example that additionally depicts one method of routing wiring within this section of the unit cell. The conductive portions comprising the electrostatic comb with its stationary and shuttle combs along with shuttle output shaft are indicated to discern them from the remaining non-conductive material portions. Electrically grounded control circuit 124 (e.g., IC chip) is seen with wiring 130, 132 extending therefrom. Wire 132 is seen connecting to a conductive base portion 134 of first stationary comb portion 126b, with another wire 135 connecting to a conductive base 136 of a second stationary comb portion 126a. A conductive portion 138 of the shuttle output shaft 116 is also connected by a wire 137 from control circuit 124, with the conductive portion of the output shaft being configured to establish electrical connection with an adjacent unit cell, while the output shaft 116 itself establishes mechanical interconnection. Another wire 139 connects from an output conductor 140 to the control circuit. Due to the close spacing, it may appear in the figure that wires 137 and 139 are connected; however, they are configured for delivering different power levels. For example the control circuit 124 is preferably configured for receiving external power from the connections 138, 140. The control circuit is connected to the comb elements via wiring so that actuation voltages can be conveyed to these regions to pull the shuttle shown outwards, or inwards in proportion to the applied voltages.

1.4 2D Square Embodiments with Programmable Properties and Shape Deformation.

Figure 16:
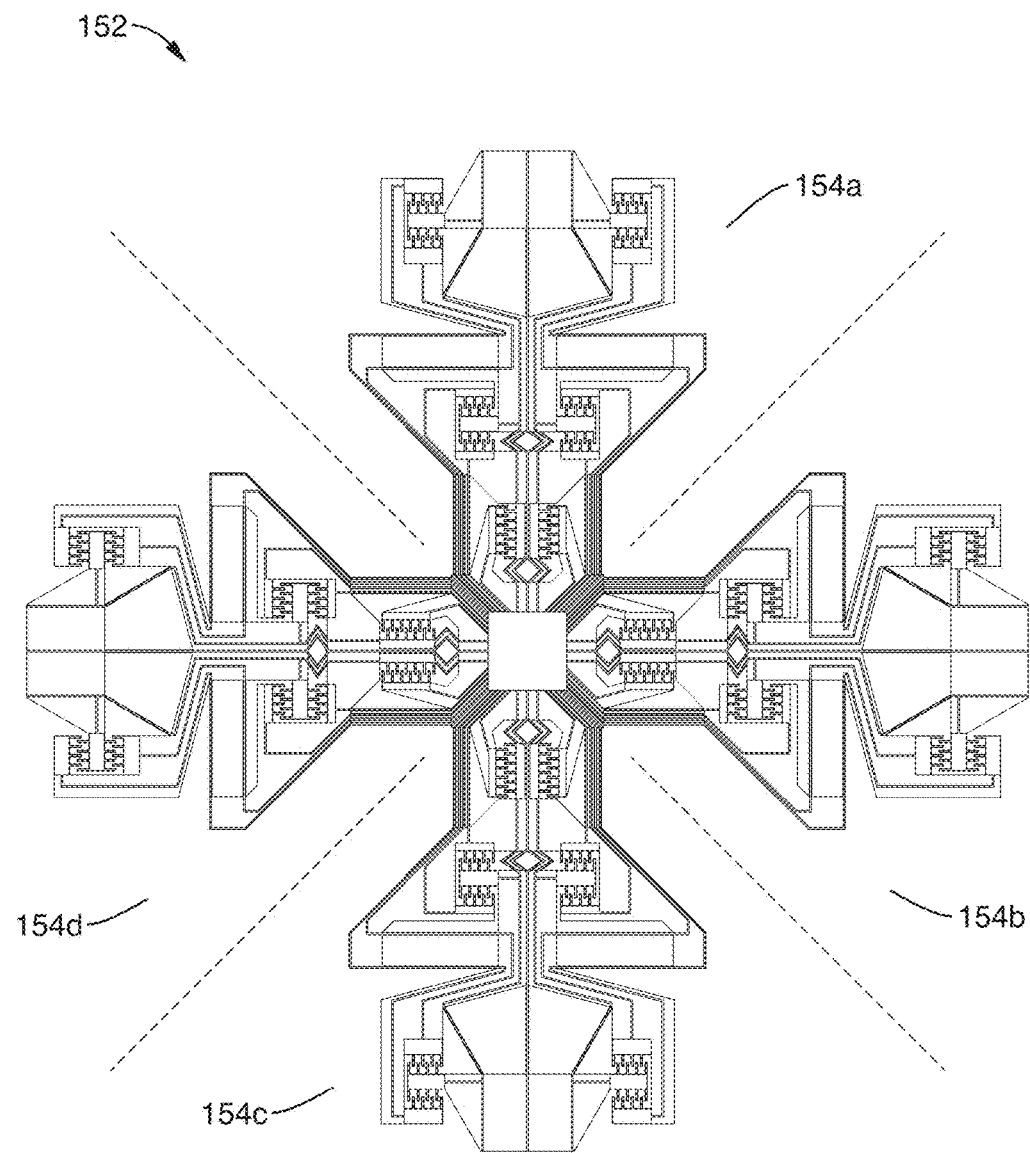
FIG. 16 is a schematic of the 2D microarchitectured unit cell of FIG. 15.

FIG. 15 through FIG. 18 illustrate another example embodiment of a 2D unit cell array 150 (3×3) with its unit cell 152. This embodiment is configured for providing both programmable properties and shape deformation. In FIG. 16 is seen a single unit cell 152 from the lattice, with one section 154a of the four sections 154a, 154b, 154c, 154d, comprising the unit cell section shown in FIG. 17A.

Figure 17A:
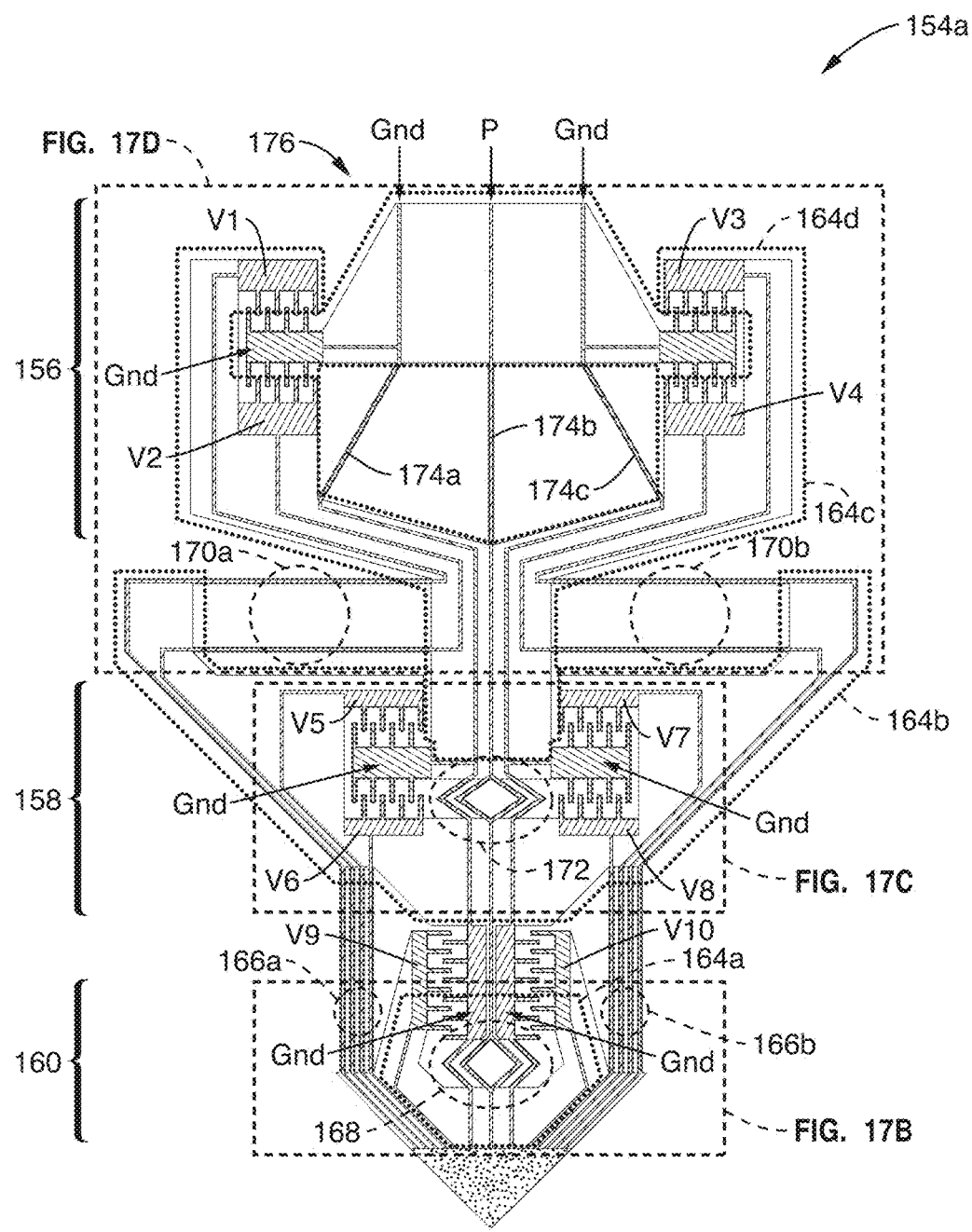
Figure 17B:
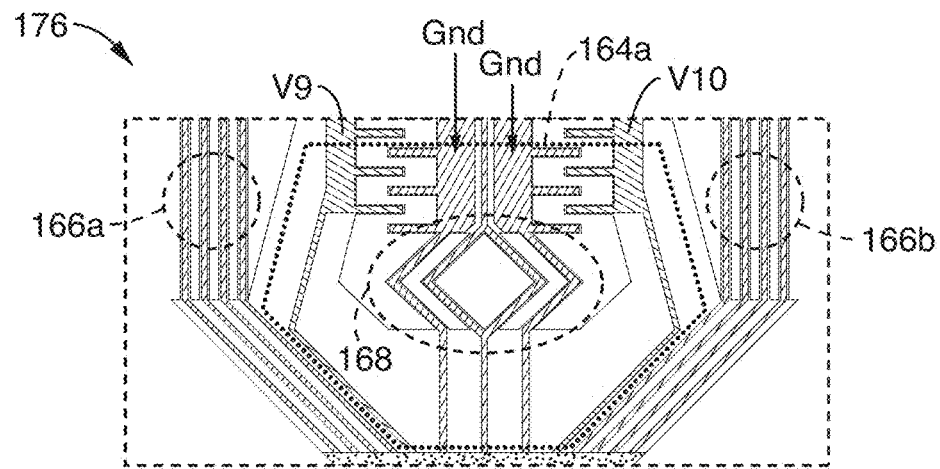
Figure 17C:
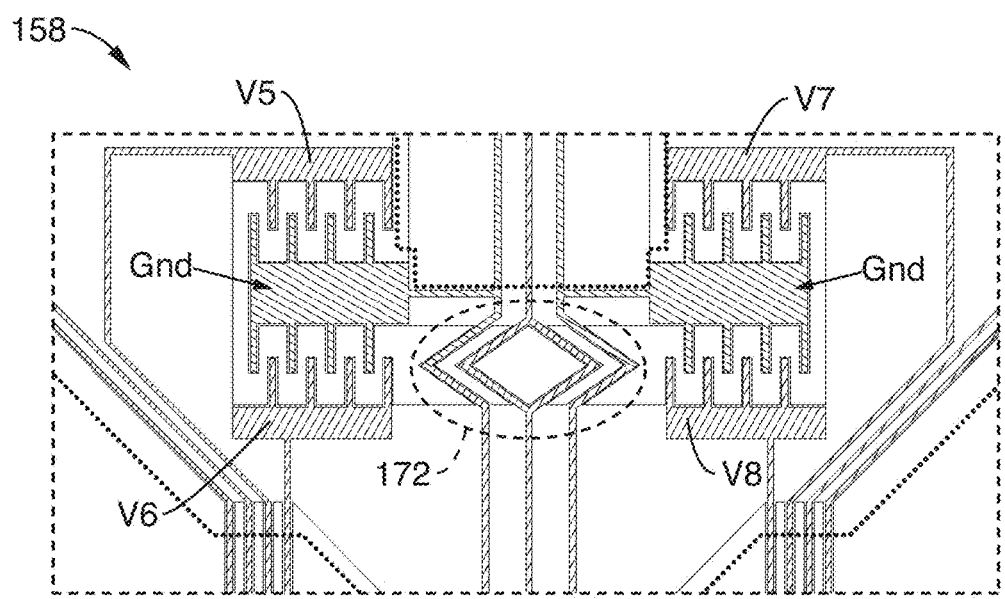

This section 154a consists of three stacked flexure stages 156, 158 and 160 that each move with the three planar degrees of freedom (two planar translations and a rotation), such that the entire lattice can be made to deform as shown in FIG. 18 with it active perimeter 162. In FIG. 17B through FIG. 17D are shown three exploded views of different portions of the section 154a.

Each section, such as 154a, comprises a plurality of interconnected rigid bodies, exemplified herein as four rigid bodies 164a, 164b, 164c, and 164d, which are joined together in a serial chain-like fashion by thin flexible elements (flexures) that constrain these rigid bodies such that the entire arm can only move with three degrees of freedom (DOFs), two in-plane translations, and one in-plane rotation. Two sets of four parallel blade flexures 166a, 166b constrain rigid body element 164b so that it can only move with respect to body element 164a with a horizontal translation. Four bent blade flexures 168 allow this horizontal translational DOF. Two sets of parallel blade flexures 170a, 170b, constrain body element 164c such that it can only move with respect to body element 164b with a vertical translation. Four bent blade flexures 172 allow this vertical translational DOF. The three blade flexures 174a, 174b, 174c constrain body element 164d, such that it can only rotate with respect to body 164c about an orthogonal axis that intersects the lines of action of all three blade flexures at the top middle in connecting tab 176, through which each unit cell connects to its neighboring cells. The four rigid bodies 164a, 164b, 164c and 164d within each section of the unit cell are exemplified herein as being actuated by electrostatic combs.

By way of example and not limitation, all the movable comb sections in this example are connected to a common electrical ground, while the fixed comb portions are connected to different voltage output lines from the control circuit. For simplicity of illustration these voltage inputs are depicted as Gnd and V1 through V10. By charging comb V9 body element 164b will be pulled to the left, and alternatively by charging comb V10 body element 164b will be pulled to the right. By charging combs V5 and V7 the same amount, body element 164c will be pulled up, while alternatively, by charging combs V6 and V8 the same amount body element 164c will be pulled down. By charging combs V2 and V3 the same amount, body 164d will exhibit a pure moment that will cause it to rotate counter-clockwise and alternatively by charging combs V1 and V4 the same amount, body element 164d will exhibit a pure moment that will cause it to rotate clockwise.

As in previous embodiments the stationary and moving electrostatic combs comprise conductive regions, which are each connected for control by the control circuit. At the top of FIG. 17D the lines P and Gnd convey power and ground to the control circuit. It should be noted that the two sets of four bent blade flexures labeled 168 and 172 only serve the purpose of routing the power and ground lines to the control circuit. It should also be noted that power and ground lines for this embodiment are highly redundant throughout the lattice, to assure that power is reliably supplied to the functioning unit cells despite conditions arising in which a large number of unit cells are either broken or defective. Of course, as in other embodiments, the electrostatic comb actuators are also preferably operated by the control circuit in a sensor mode, such as to measure the extent to which the rigid bodies within each cell have been displaced. In this way, each control circuit within the lattice is utilized to control shape of its individual unit cell in such a way that a desired bulk lattice shape emerges from the microarchitectured material. It will be appreciated that other sensors may be incorporated into the unit cells to enhance the accuracy and or range of material properties being generated. For example sensors may be included such as force, displacement, strain, temperature, humidity, atmospheric pressure, acceleration, and other sensor types and combination thereof.

It should be appreciated that this articulating embodiment of FIG. 15 through FIG. 18 can be implemented in array configurations other than rectangular. The described shape-morphing active microarchitectured materials introduced can beneficially provide desired material property directionality, such as isotropic, orthotropic, cubic, anisotropic, and so forth. The examples thus far described follow a square (4 sided) or cubic (6 sided) unit cell planform, although the unit cell may comprise any number of sides in any desired shape without departing from the teachings of the present disclosure. Since the topology of each of these unit cells possesses four planes of symmetry spaced 45 degrees each, it can be shown that the overall lattice will passively exhibit cubic material properties. Although it may be possible to actively control these unit cells such that the overall lattice achieves isotropic material properties, a more straightforward solution for achieving passive isotropic material properties is to insert differently shaped symmetric triangular sectors of the same arm design into other space-filling polygons, such as regular hexagons or equilateral triangles, octagons, and other geometric arrangements.

Figure 19:
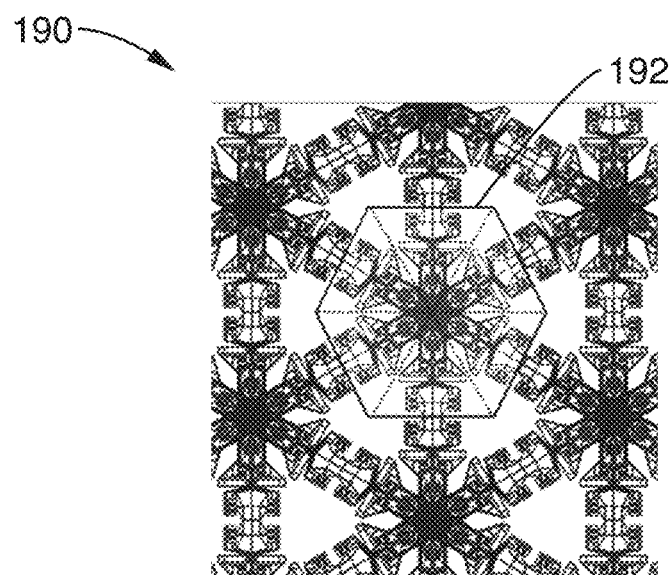
FIG. 19 and FIG. 20 are schematics of different 2D microarchitectured material array configurations according to embodiments of the present disclosure.
Figure 20:
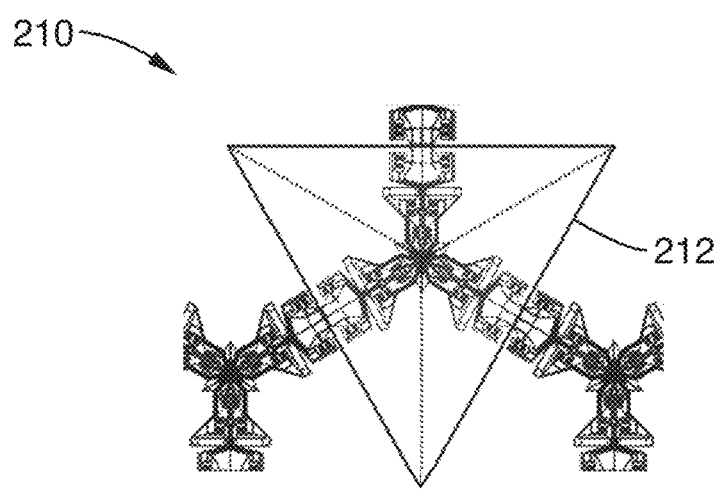

FIG. 19 and FIG. 20 illustrate examples of alternative geometric unit cell configurations. In FIG. 19 is shown a 2D triangular array pattern 190 utilizing hexagonal unit cells 192 having six sides and six mechanical outputs/inputs. In FIG. 20 is shown an array a 2D hexagonal array pattern 210 comprising the use of triangular unit cells 212 having three sides and three mechanical output/inputs.

The above embodiments may be similarly applied in three dimensions. To implement a 3D microarchitectured material, pyramidal sectors instead of triangular sectors that each contain an actively controlled arm should be inserted inside space-filling polyhedrons (e.g., cubes, or rhombic dodecahedrons) instead of polygons. The arms within these pyramidal sectors should possess six DOFs instead of just the three planar DOFs achieved by the 2D arm designs. With the ability to independently actuate these six DOFs, the resulting lattice would be optimally outfitted to most successfully achieve the largest variety of viable shapes in three dimensions.

2. Unit Cells Utilizing Piezo Material as Actuators.

2.1 3D Embodiments Utilizing Piezo Materials.

Figure 21:
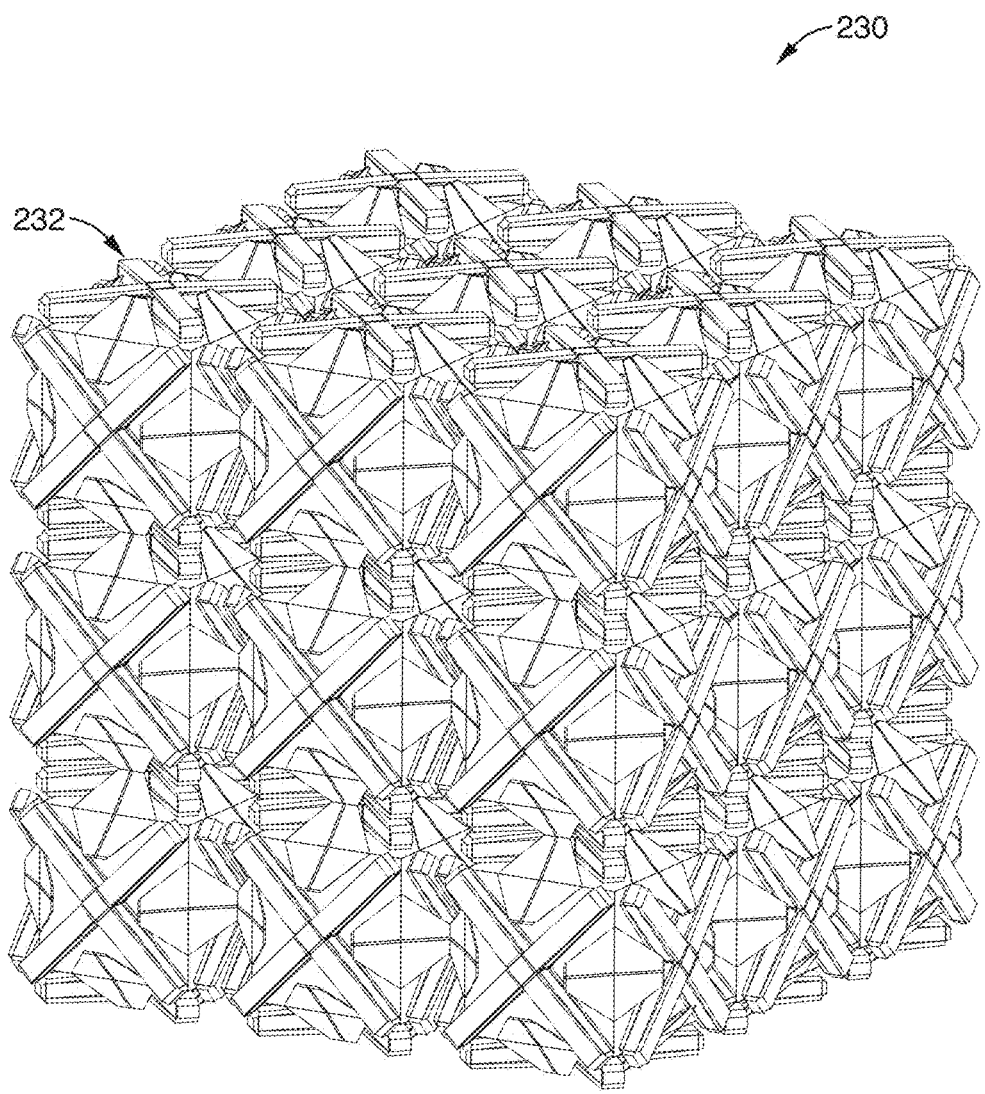
FIG. 21 is a schematic of another 3D microarchitectured material lattice utilizing piezo transducers according to an embodiment of the present disclosure.
Figure 22:
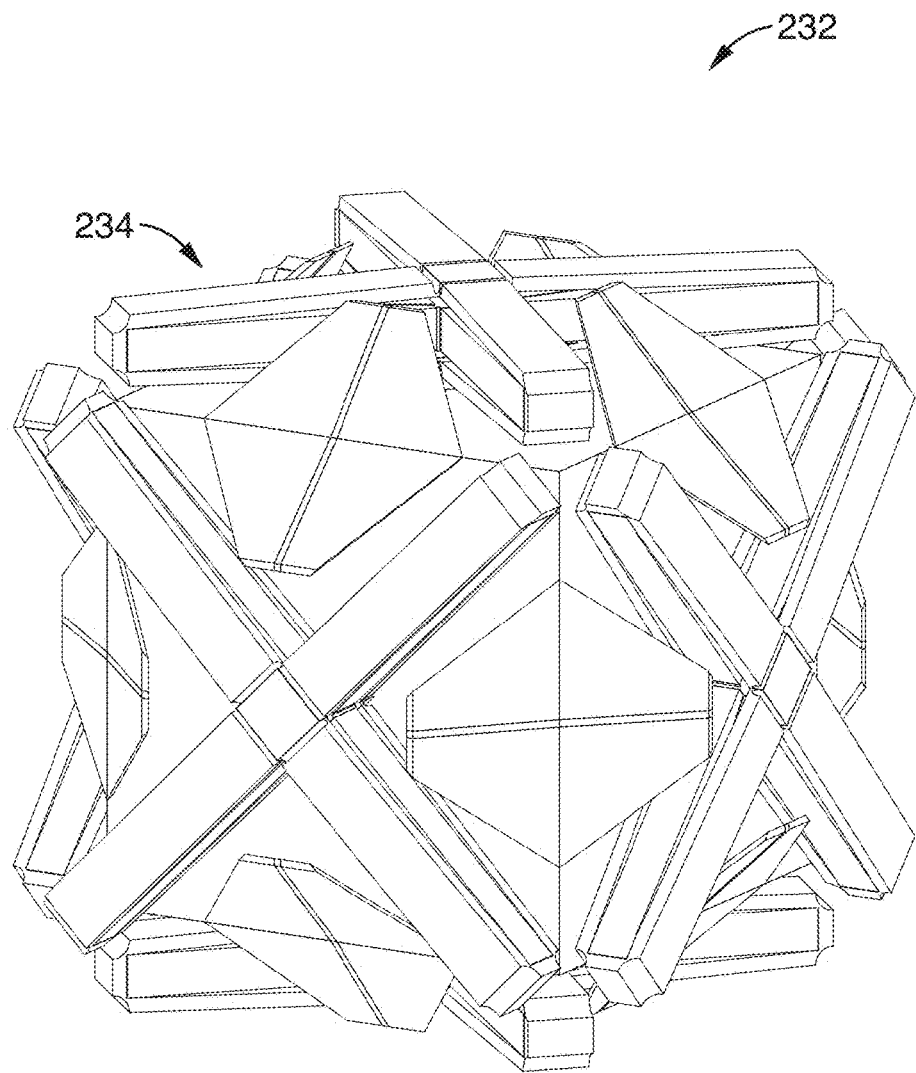
FIG. 22 is a schematic of a unit cell from a portion of the 3D piezo-based microarchitectured lattice of FIG. 21.
Figure 23A:
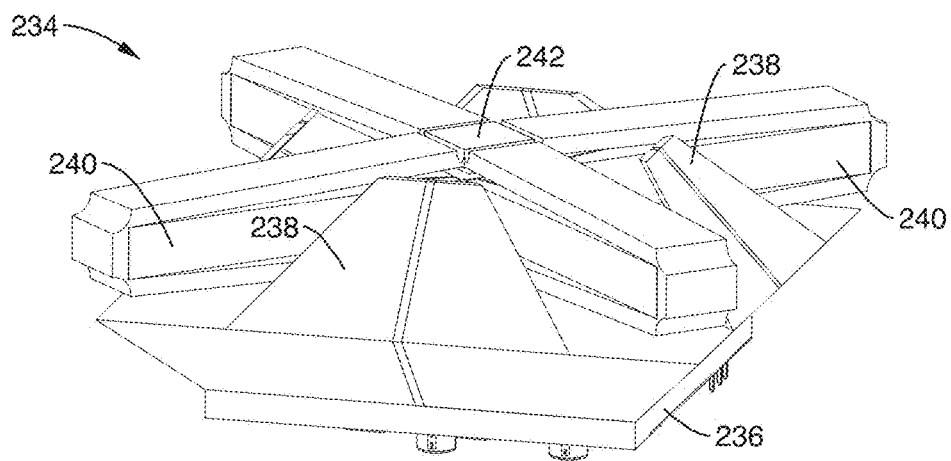
FIG. 23A and FIG. 23B are schematics of a section from the 3D microarchitectured unit cell shown in FIG. 22.
Figure 23B:
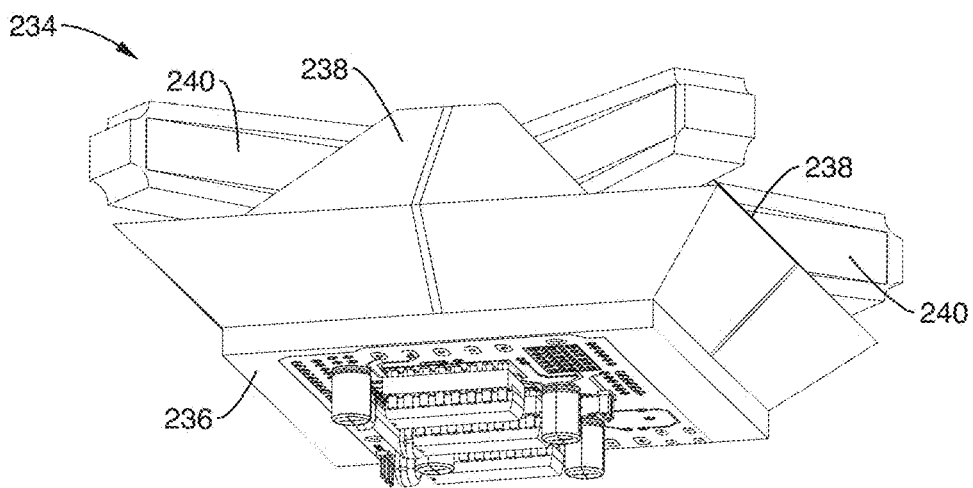
Figure 24A:
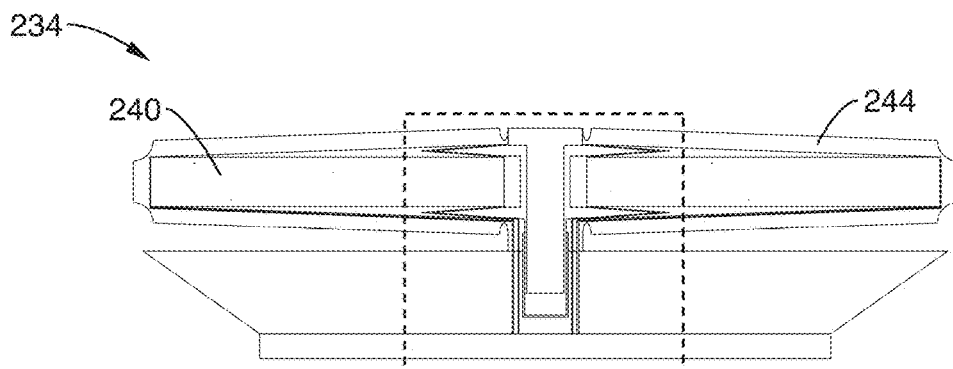
FIG. 24A and FIG. 24B are schematic cross-sections from a portion of the 3D microarchitectured unit cell shown in FIG. 22.
Figure 24B:
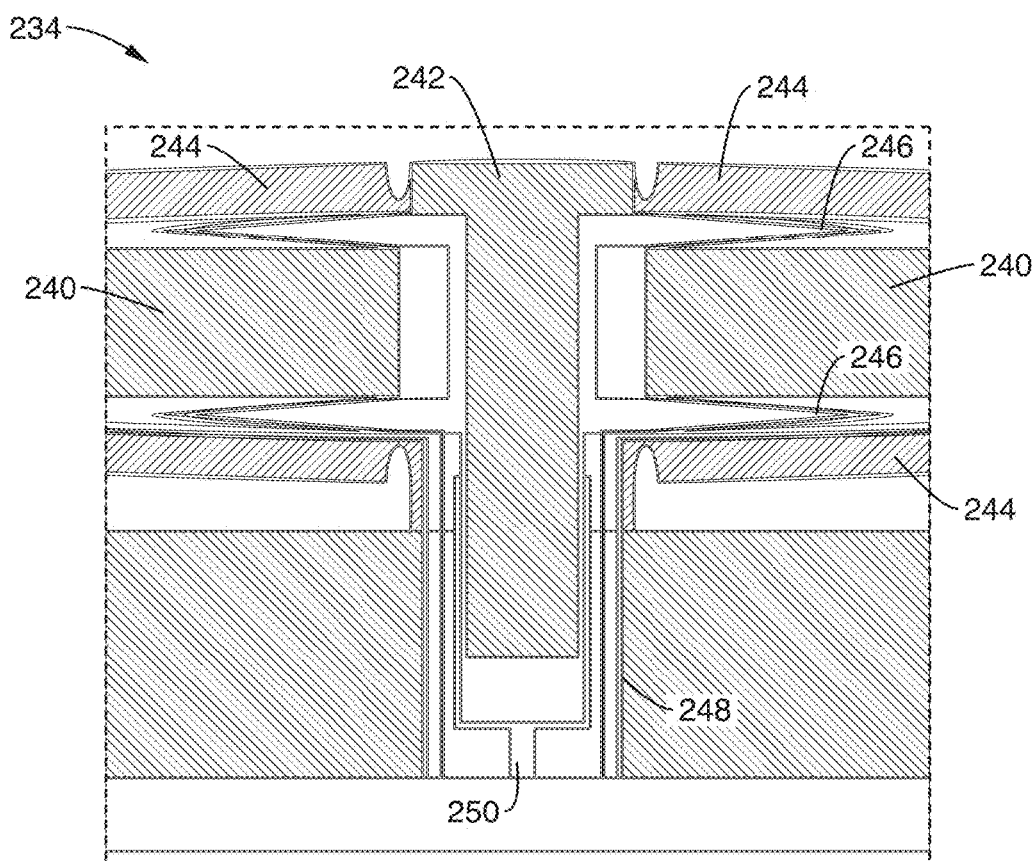

FIG. 21 through FIG. 25 illustrate an example embodiment 230 of a microarchitectured material which utilizes piezos as actuators instead of electrostatic combs. Piezo actuators may be utilized in either 2D or 3D unit cell configurations. A 3×3×3 piezo unit cell lattice 230 is seen in FIG. 21, having unit cells 232. In FIG. 22 a single unit cell 232 is depicted, with one of the six identical faces 234 shown in the views of pyramidal sections seen in FIG. 23A and FIG. 23B. In FIG. 23A and FIG. 23B the control circuit (e.g., IC chip) can be seen 236, which by way of example receives power through wiring 238 on, or in, or proximal to the flexures which guide outward and inward translations while resisting shear forces, and on the face of a shuttle 242. The piezo actuators 240, and associated flexible articulation structures 244, are seen coupled to a shuttle 242 in these figures as well as in the planar cross-sections of FIG. 24A and FIG. 24B. The unit cells join together at the top most surfaces in the combination of the four flexible structures 244 and the outer surface of the shuttle 242. FIG. 24A shows two different pairs of bent flexures 246 that wire this conductive line (e.g., ground) from shuttle 242 to the back of the piezo bars 240 and on down to the control circuit 236. The piezo bars are positioned between a flexible structure labeled 244 that acts as a transmission to increase the strain capabilities of the piezo material while decreasing its load capacity. It will be appreciated that one issue with using piezo material by itself is that it expands and contracts by very meager amounts, although it can push and pull with a huge force that is unnecessary. Therefore, toward achieving a lattice able to resist less force but do so over a larger range of distance so the largest range of properties can be controlled, a transmission flexure device is necessary. In FIG. 24B a close up cross-section is seen which depicts the support structures and flexures.

Under the control of the control circuit outputting voltage drive signals to the piezo devices, the piezo bars expand or contract on the far end of the piezo bars. Wiring is seen 248 passing up into the structure to reach the conductive flexures 246 which connect to the shuttle 242. The final position of shuttle 242 can be sensed by reading the voltage and current produced in the line 250 by utilizing a capacitive sensor, or other sensor as desired. In addition, the piezo combs can also be used in conjunction with the piezo bars to impart some extra force on the shuttle to actuate it as well. It should be appreciated that both the piezo and comb actuators may be utilized in the other embodiments described previously, and may be substituted with other actuator forms, or combinations thereof, without departing from the teachings of the present disclosure.

Figure 25:
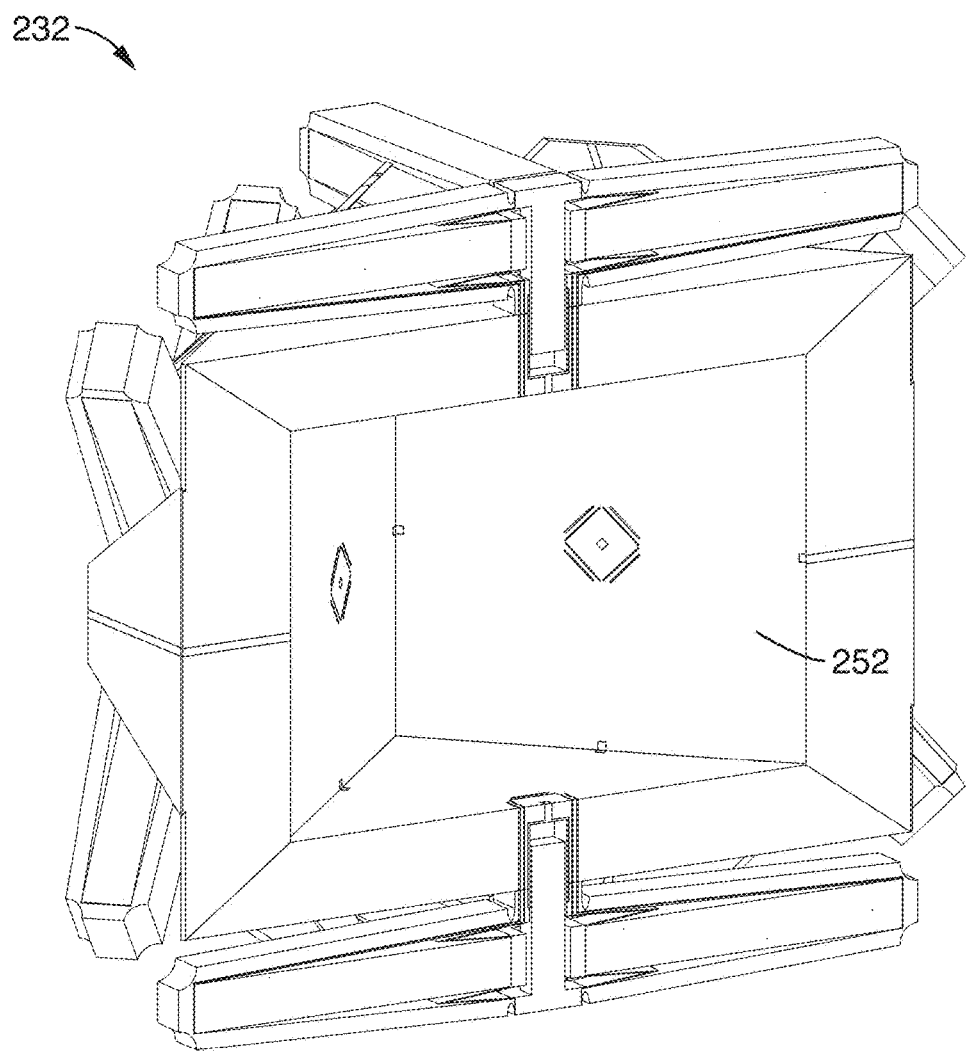
FIG. 25 is a schematic cross-section of the unit cell for the 3D piezo-based microarchitectured of FIG. 21.

One of the beneficial aspects of this embodiment is that it possesses a significant amount of space at its center for control circuitry, antennas, and power storage (e.g., rechargeable batteries, capacitors) and so forth as shown in the cross section of FIG. 25. If rechargeable batteries were used in this design, they could be recharged by simply mechanically loading the lattice cyclically because the piezo bars would generate a voltage when they are strained that could power the battery. Thus, external power lines may not be necessary in a piezo, or similar device, to charge the battery.

The microarchitectured materials provide characteristics which may be utilized in a number of applications. A number of the factors associated with the characteristics are summarized below. One primary factor that influences the ability of a microarchitectured material to perform shape-morphing into a large variety of achievable shapes is the number of independent actuators within the lattice. This is not surprising, as a shape-morphing lattice that consists of many unit cells will be able to achieve a larger variety of shapes than a lattice that consists of fewer unit cells of the same design. Furthermore, 3D shape-morphing microarchitectured materials generally achieve a larger variety of shapes than 2D shape-morphing microarchitectured materials because 3D designs often possess more arms per unit cell than 2D designs and 3D arms should possess six independent actuators instead of the three independent actuators within the arms of most 2D designs. In general terms, unit cells possessing more arms will theoretically be able to achieve a larger variety of shapes than counterparts having fewer articulating arms, such as because there are more independent actuators per area compared with the lattice whose cells have fewer arms. Of course the ability to practically use these articulations will be best determined in response to modeling additional aspects of the array, involving deformation limits, actuation limits, spatial constraints, as described in the next section.

Although the embodiments of the described actively controlled shape-morphing microarchitectured material are generally described as having some form of sensors for measuring relative displacements between its rigid bodies, the present disclosure is still applicable in a lattice without these sensors, that is to say operating the lattice in an open-loop mode for small shape deformations. However, attempting large shape changes using open-loop control can result in shape changes which are significantly different than the shape desired. The reason for this is that the control approach relies on linear matrix-based calculations and is thus only accurate for small deformations. It is also important to recognize that when using open-loop actuation, the disclosed microarchitectured materials can be utilized to cancel the effects of external loads applied to the surface of a lattice while simultaneously achieving a desired lattice shape. The locations and magnitudes of these loads must be known exactly such that the deformations that result from these loads can be calculated and counteracted by the internal actuators within the lattice. Practically speaking, however, it may be difficult to know the exact nature of external loads acting on a lattice a priori, so it is risky to rely on open-loop control to cancel the effect of such loads while attempting to accurately achieve a desired lattice shape.

If an actively controlled shape-morphing microarchitectured material design does possess sensors that can directly measure the relative displacements between the rigid bodies of the lattice, such as utilizing electrostatic comb actuators, which can be utilized in both actuation and sensing, the teachings of the disclosure can be used in conjunction with a closed-loop control strategy for accurately achieving both large and small shape changes with or without external loads acting on the surface of the microarchitectured material lattice. In this instance, the present disclosure is used to determine relative locations and orientations of all the rigid bodies within the lattice when the lattice is deformed with its desired surface shape and then this information is fed to the closed-loop controller (either internal or external to the lattice) to determine the actual actuator loads necessary to achieve the desired shape instead of relying on the estimated actuation loads which could be incorrect for large deformations. In addition, according to at least one active shape-morphing microarchitectured material embodiment using sensors in combination with closed-loop control, the unit cells can be programmed to exhibit desired resonant frequencies or other dynamic behaviors that are suited to a variety of applications.

3. Shape Morphing Control Approach.

In this section one approach to controlling these actively controlled microarchitectured materials (shape-morphing lattices) are described. However, it should be appreciated that operation of the described devices are not limited to the use of this linear control approach, as other approaches (e.g., linear and non-linear) may be utilized without limitation with the disclosed technology.

As discussed previously, the kind of actively controlled microarchitectured materials of this disclosure consist of unit cells each having multiple arms that consist of flexible elements (e.g., blade flexures) that constrain rigid bodies, which are driven by actuators controlled by a control circuit (e.g., IC chips), such as exemplified at the center of each unit cell. A simplified 2D unit cell of this kind of microarchitectured material design was shown in FIG. 15 through FIG. 23. These shape morphing unit cells have a flexure topology comprising rigid bodies attached with flexible elements within each arm, to preferably provide 3 DOFs for the arm (e.g., two planar translations and one planar rotation).

It is important to recognize that each actuator in the lattice is responsible for its own contribution to an overall shape change within the lattice. As long as the flexible elements of the lattice are displaced in small amounts within their linear stiffness regime, any shape that the lattice may achieve results as a consequence of the linear combination of the contributions of the individual actuators within the lattice. In other words, a given deformation profile of the full lattice can be decomposed into the superposition of profiles created when each actuator acts on its own. Thus, to control the lattice shape, the present disclosure presents a new kind of linear stiffness matrix, called a surface-stiffness matrix, which relates the output magnitudes (i.e., load contributions) of each actuator within the lattice to the displacements of the outermost rigid bodies that define the shape of the surface of the material.

To construct a microarchitectured material's surface-stiffness matrix, it is important to identify the locations and orientations of the actuation loads that drive the rigid bodies attached to the arms of each unit cell. By way of example and not limitation, the following example will reference the arm shown in FIG. 17. The electrostatic combs driven by voltage V9 and V10 impart a horizontal force on the rigid body 164*b* at a location half-way down the length of the vertical flexure blades.

It should be appreciated that the mathematics used to model the behavior of the combs require only knowledge of: (a) the kind of load the combs impart on the rigid bodies (e.g., forces or moments), (b) the locations where these loads are imparted on these bodies, and (c) the orientations of their lines of action. It is also important to recognize that when the combs driven by V9 and V10 in FIG. 17 impart a horizontal force onto the rigid body labeled 164*b*, the combs simultaneously impart an equal and opposite horizontal force on the body 164*a*. Similarly, the combs driven by voltages V5 through V8 in the figure impart a vertical force on the center of the rigid body labeled 164*c* as well as an equal and opposite vertical force on the body labeled 164*b*. Additionally, the combs driven by V1 through V4 in the figure impart a moment on the body labeled 164*d* as well as an equal and opposite moment on the body labeled 164*c*.

In addition to information pertaining to the actuators within the lattice, the locations, orientations, material properties, and geometric parameters (e.g., lengths, widths, thicknesses) of the flexible elements within the entire lattice are also necessary for constructing the surface-stiffness matrix. Finally, it is important to specify which rigid bodies are held fixed in the lattice.

Once a surface-stiffness matrix has been constructed for a microarchitectured material, then a Moore-Penrose pseudo-inverse of this matrix can be utilized to determine the optimal actuator output loads for the lattice which most closely moves the outermost rigid bodies within the lattice toward their target locations for achieving the desired shape for the microarchitectured material. As an example, consider a 3×15 lattice shown in FIG. 21. A surface-stiffness matrix was constructed for the entire lattice and the fifteen outermost connecting tabs on the bottom end of the lattice were held fixed. A specific wave-like shape on the top end of the lattice was specified and immediately achieved as shown in the figure using the pseudoinverse of the constructed surface-stiffness matrix.

If all of the unit cells within the microarchitectured material's lattice are restricted to drive their rigid bodies with the same set of independent actuation loads, the disclosed control approach somewhat mimics a swarm control approach, in that the IC chips within the respective unit cells do not need to know where their cells are within the lattice or how their neighboring cells are behaving because each unit cell is programmed with the same set of actuation commands. Thus, the desired lattice shape emerges as a consequence of the individual commands programmed within each unit cell. This approach reduces the calculation effort and simplifies the control of the microarchitectured material's shape significantly. However, imposing this identical-actuation restriction on every unit cell within the lattice significantly reduces the variety of shapes that the microarchitectured material can achieve. It is, however, possible to use this actuation approach to determine the best set of actuator loads that are common to all the unit cells in the lattice such that the lattice most closely approaches its desired shape, even if the lattice falls short of achieving the desired shape.

Yet, toward achieving the largest variety of lattice shapes, at least one embodiment of the present disclosure allows every actuator within the entire lattice to act independently, such that they can all output unique load magnitudes instead of restricting the loads of the actuators. This approach requires that output-load instructions for every actuator be communicated to the control circuits of multiple units cells, or even to all the unit cells in the material lattice. Any form of cell-to-cell communication can be utilized, including wired connection (e.g., separate data and control lines, multiplexed lines, single wire communication, power line communications and so forth) and wireless communications. As a number of these techniques are well known in the art there is no need of disclosing specific implementations herein. In this approach, each unit cell control circuit (IC chip) is thus configured to have an identify, such as based on its position in the material lattice, such as by using identifier tag that knows where its cell is located within the lattice to enable the control circuit to extract the correct set of unique actuator load instructions from the master signal sent to all the cells. In addition, the locus of control need not be centralized to a processor generating the master control signal, because many known techniques exist for cooperatively utilizing an array of processors (e.g., the control circuits within each unit cell) to reach global control decisions, while still retaining the ability to act locally on their respective unit cells.

Although both approaches discussed (i.e., the swarm and independent-actuator approaches) can be used to achieve many different lattice shapes as described above. It should be realized, however, that a number of additional factors should be taken into account when implementing this approach so that the lattice can achieve the widest range of available lattice shapes. For instance, a buckling model should be included which takes into account the specific implementation of the unit cell and its articulation. The flexible elements of the lattice will yield or buckle after they have deformed an appreciable amount, as will be described according to this buckling model. An actuator power model should be included as the actuators may not be able to generate sufficient force to impart the determined loads that are necessary to move the rigid bodies of the lattice to their target locations. In addition, a spatial model of the unit cells should be included which takes into account relative physical proximity of the arms of each unit cell, and thus can predict if rigid bodies within the lattice may collide before reaching their destinations. It should be appreciated that the use of the spatial model in combination with the force and buckling model can in many instances actually provide benefits by creating such a collision, to bring portions of the adjacent cells together to form a structural unit which has increased strength against deformations of specific directionality brought about by external forces. In view of the above, it will be seen that taking the above considerations into account in the core control mechanisms advanced herein can provide a number of advantages.

Embodiments of the present technology may be described with reference to flowchart illustrations of methods and systems according to embodiments of the technology, and/or algorithms, formulae, or other computational depictions, which may also be implemented as computer program products. In this regard, each block or step of a flowchart, and combinations of blocks (and/or steps) in a flowchart, algorithm, formula, or computational depiction can be implemented by various means, such as hardware, firmware, and/or software including one or more computer program instructions embodied in computer-readable program code logic. As will be appreciated, any such computer program instructions may be loaded onto a computer, including without limitation a general purpose computer or special purpose computer, or other programmable processing apparatus to produce a machine, such that the computer program instructions which execute on the computer or other programmable processing apparatus create means for implementing the functions specified in the block(s) of the flowchart(s).

Accordingly, blocks of the flowcharts, algorithms, formulae, or computational depictions support combinations of means for performing the specified functions, combinations of steps for performing the specified functions, and computer program instructions, such as embodied in computer-readable program code logic means, for performing the specified functions. It will also be understood that each block of the flowchart illustrations, algorithms, formulae, or computational depictions and combinations thereof described herein, can be implemented by special purpose hardware-based computer systems which perform the specified functions or steps, or combinations of special purpose hardware and computer-readable program code logic means.

Furthermore, these computer program instructions, such as embodied in computer-readable program code logic, may also be stored in a computer-readable memory that can direct a computer or other programmable processing apparatus to function in a particular manner, such that the instructions stored in the computer-readable memory produce an article of manufacture including instruction means which implement the function specified in the block(s) of the flowchart(s). The computer program instructions may also be loaded onto a computer or other programmable processing apparatus to cause a series of operational steps to be performed on the computer or other programmable processing apparatus to produce a computer-implemented process such that the instructions which execute on the computer or other programmable processing apparatus provide steps for implementing the functions specified in the block(s) of the flowchart(s), algorithm(s), formula(e), or computational depiction(s).

It will further be appreciated that "programming" as used herein refers to one or more instructions that can be executed by a processor to perform a function as described herein. The programming can be embodied in software, in firmware, or in a combination of software and firmware. The programming can be stored local to the device in non-transitory media, or can be stored remotely such as on a server or all or a portion of the programming can be stored locally and remotely. Programming stored remotely can be downloaded (pushed) to the device by user initiation, or automatically based on one or more factors. It will further be appreciated that as used herein, that the terms processor, central processing unit (CPU), and computer are used synonymously to denote a device capable of executing the programming and communication with input/output interfaces and/or peripheral devices.

From the description herein, it will be appreciated that that the present disclosure encompasses multiple embodiments which include, but are not limited to, the following:

1. A microarchitectured material apparatus, comprising: (a) a plurality of unit cells whose permanent interconnection to one another forms an microarchitectured material; (b)

multiple actuators within each of said unit cells; (c) multiple mechanical output structures extending from each of said unit cells which are coupled to mechanical output structures extending from adjacent unit cells; (d) wherein each of said multiple mechanical output structures is coupled to one or more of said multiple actuators for actuating motion; (e) at least one processor; (f) a memory storing instructions executable at least one said processor; and (g) wherein said instructions, when executed, perform steps comprising generating drive voltages from said processor to control the activation of each of said multiple actuators in each of said unit cells to generate desired material properties, shapes, or a combination of properties and shapes in said microarchitectured material.

2. The apparatus of any preceding embodiment, further comprising one or more flexing structures attached to said multiple actuators for constraining motion of said actuator.

3. The apparatus of any preceding embodiment, wherein said one or more flexing structures are attached to at least one of multiple mechanical output structures of said multiple actuators.

4. The apparatus of any preceding embodiment, further comprising additional flexing structures attached to said multiple actuators for preventing unwanted vibrations upon said actuator.

5. The apparatus of any preceding embodiment, wherein said microarchitectured material comprises either a two-dimensional (2D) or three-dimensional (3D) array of said unit cells.

6. The apparatus of any preceding embodiment, wherein said desired material shapes comprise shape morphing in either two dimensions (2D) or three dimensions (3D).

7. The apparatus of any preceding embodiment, wherein said desired material properties are selected from a group of material properties consisting of Young's modulus, shear modulus, and Poisson's ratio.

8. The apparatus of any preceding embodiment, wherein said instructions, when executed, further perform the step of generating voltages to drive the actuators either inwardly or outwardly in response to a detected external load upon the unit cell to achieve the desired material properties which consists of one or more bulk lattice properties.

9. The apparatus of any preceding embodiment, wherein said instructions, when executed, further perform the step of generating voltages to drive the actuators outwardly from the unit cell in response to said control circuit detecting compression, to achieve the desired material property of stiffness.

10. The apparatus of any preceding embodiment, wherein said instructions, when executed, further perform the step of generating voltages to drive the actuators inwardly from the unit cell in response to said control circuit detecting compression, toward achieving the desired material property of compliance.

11. The apparatus of any preceding embodiment, wherein said instructions, when executed, further perform the step of generating voltages to drive the actuators orthogonal to an applied compression force to obtain the desired material property of positive or negative Poisson's ratio.

12. The apparatus of any preceding embodiment, wherein said instructions, when executed, further perform the step of generating delayed voltage levels to drive the actuators so that the actuator output rings back and forth to attain desired damping properties.

13. The apparatus of any preceding embodiment, wherein said actuator is selected from a group of actuators consisting of an electrostatic comb actuator, a piezo actuator, and a Lorentz force actuator.

14. The apparatus of any preceding embodiment, further comprising a wired or wireless communication interface configured for allowing each of said unit cells to communicate inside or outside of said plurality of unit cells.

15. The apparatus of any preceding embodiment, further comprising a power storage element for supplying power to said unit cell.

16. The apparatus of any preceding embodiment, wherein said power storage element comprises a rechargeable battery, or a capacitor.

17. A microarchitectured material apparatus, comprising: (a) a plurality of two-dimensional (2D) or three-dimensional (3D) unit cells whose permanent interconnection to one another forms an microarchitectured material; (b) multiple actuators within each of said unit cells; (c) multiple mechanical output structures extending from each of said unit cells which are coupled to mechanical output structures extending from adjacent unit cells; (d) flexing structures attached to said multiple mechanical output structures of said multiple actuators for constraining motion of said actuator; (e) wherein each of said multiple mechanical output structures is coupled to one or more of said multiple actuators for actuating motion; (f) at least one processor; (g) a memory storing instructions executable at least one said processor; and (h) wherein said instructions, when executed, perform steps comprising generating drive voltages from said processor to control the activation of each of said multiple actuators in each of said unit cells to generate desired material properties, shapes, or a combination of properties and shapes in said microarchitectured material.

18. The apparatus of any preceding embodiment, further comprising additional flexing structures attached to said multiple actuators for preventing unwanted vibrations upon said actuator.

19. The apparatus of any preceding embodiment, wherein said instructions when executed by the processor perform the step of generating voltages to drive the actuators either inwardly or outwardly in response to a detected external load upon the unit cell to achieve the desired material properties which consists of one or more bulk lattice properties.

20. A microarchitectured material apparatus, comprising: (a) a plurality of unit cells whose permanent interconnection to one another forms an microarchitectured material; (b) multiple actuators within each of said unit cells; (c) multiple mechanical output structures extending from each of said unit cells which are coupled to mechanical output structures extending from adjacent unit cells; (d) wherein each of said multiple mechanical output structures is coupled to one or more of said multiple actuators for actuating motion; and (e) a control circuit configured for generating drive voltages to control the activation of each of said multiple actuators in each of said unit cells to generate desired material properties, shapes, or a combination of properties and shapes in said microarchitectured material.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A microarchitectured material apparatus, comprising:
a plurality of unit cells whose permanent interconnection to one another forms a microarchitectured material;
multiple actuators within each of said unit cells;
multiple mechanical output structures extending from each of said unit cells, each said mechanical output structure being coupled to a mechanical output structure extending in an opposing direction from an adjacent unit cell;
wherein each of said multiple mechanical output structures is coupled to one or more of said multiple actuators in an adjacent active area of a unit cell for actuating motion;
at least one processor; and
a memory storing instructions executable at least one said processor;
wherein said instructions, when executed, perform steps comprising generating drive voltages from said processor to control the activation of each of said multiple actuators in each of said unit cells toward achieving a specific material property and/or shape in said microarchitectured material.

2. The apparatus as recited in claim 1, further comprising at least one flexing structure (flexure) attached to an actuator of said multiple actuators for constraining motion of said actuator, with each flexible structure (flexure) configured to deform in guiding motion of said actuator along an axis.

3. The apparatus as recited in claim 2, wherein said at least one flexing structure (flexure) is attached to an output structure of said multiple mechanical output structures, with each flexible structure (flexure) configured to deform in guiding motion of said output structure along an axis.

4. The apparatus as recited in claim 2, further comprising at least one flexing structure (flexure) attached to an actuator of said multiple actuators for preventing unwanted vibrations upon said actuator.

5. The apparatus as recited in claim 1, wherein said microarchitectured material comprises either a two-dimensional (2D) or three-dimensional (3D) array of said unit cells.

6. The apparatus as recited in claim 1, wherein said desired material shapes comprise shape morphing in either two dimensions (2D) or three dimensions (3D).

7. The apparatus as recited in claim 1, wherein said desired material properties are selected from a group of material properties consisting of Young's modulus, shear modulus, and Poisson's ratio.

8. The apparatus as recited in claim 1, wherein said instructions, when executed, further perform the step of generating voltages to drive the actuators either inwardly or outwardly in response to a detected external load upon the unit cell to achieve the desired material properties which consists of one or more bulk lattice properties.

9. The apparatus as recited in claim 8, wherein said instructions, when executed, further perform the step of generating voltages to drive the actuators outwardly from the unit cell in response to said control circuit detecting compression, to achieve the desired material property of stiffness.

10. The apparatus as recited in claim 8, wherein said instructions, when executed, further perform the step of generating voltages to drive the actuators inwardly from the unit cell in response to said control circuit detecting compression, toward achieving the desired material property of compliance.

11. The apparatus as recited in claim 8, wherein said instructions, when executed, further perform the step of generating voltages to drive the actuators orthogonal to an applied compression force to obtain the desired material property of positive or negative Poisson's ratio.

12. The apparatus as recited in claim 8, wherein said instructions, when executed, further perform the step of generating delayed voltage levels to drive the actuators so that the actuator output rings back and forth to attain desired damping properties.

13. The apparatus as recited in claim 1, wherein said actuator is selected from a group of actuators consisting of an electrostatic comb actuator, a piezo actuator, and a Lorentz force actuator.

14. The apparatus as recited in claim 1, further comprising a wired or wireless communication interface configured for allowing each of said unit cells to communicate inside or outside of said plurality of unit cells.

15. The apparatus as recited in claim 1, further comprising a power storage element for supplying power to said unit cell.

16. The apparatus as recited in claim 15, wherein said power storage element comprises a rechargeable battery or a capacitor.

17. A microarchitectured material apparatus, comprising:
a plurality of two-dimensional (2D) or three-dimensional (3D) unit cells whose permanent interconnection to one another forms a microarchitectured material;
multiple actuators within each of said unit cells;
multiple mechanical output structures extending from each of said unit cells each said mechanical output structure being coupled to a mechanical output structure extending in an opposing direction from an adjacent unit cell;
at least one flexing structure attached to an output structure of said multiple mechanical output structures for constraining motion of said actuator with each flexible structure (flexure) configured to deform in guiding motion of said output structure along an axis;
wherein each of said multiple mechanical output structures is coupled to one or more of said multiple actuators in an adjacent active area of a unit cell for actuating motion;
at least one processor; and
a memory storing instructions executable at least one said processor;
wherein said instructions, when executed, perform steps comprising generating drive voltages from said processor to control the activation of each of said multiple actuators in each of said unit cells toward achieving a specific material property and/or shape in said microarchitectured material.

18. The apparatus as recited in claim 17, further comprising at least one flexing structure (flexure) attached to an actuator of said multiple actuators for preventing unwanted vibrations upon said actuator.

19. The apparatus as recited in claim 17, wherein said instructions when executed by the processor perform the step of generating voltages to drive the actuators either inwardly or outwardly in response to a detected external load upon the unit cell to achieve the desired material properties which consists of one or more bulk lattice properties.

20. A microarchitectured material apparatus, comprising:
- a plurality of unit cells whose permanent interconnection to one another forms an microarchitectured material;
- multiple actuators within each of said unit cells;
- multiple mechanical output structures extending from each of said unit cells, each said mechanical output structure being coupled to a mechanical output structure extending in an opposing direction from an adjacent unit cell;
- wherein each of said multiple mechanical output structures is coupled to one or more of said multiple actuators in an adjacent active area of a unit cell for actuating motion; and
- a control circuit configured for generating drive voltages to control the activation of each of said multiple actuators in each of said unit cells toward achieving a specific material property and/or shape in said microarchitectured material.

* * * * *